US012091814B2

(12) United States Patent
Ren et al.

(10) Patent No.: US 12,091,814 B2
(45) Date of Patent: Sep. 17, 2024

(54) CERAMIC-POLYMER COMPOSITES AND METHODS OF MAKING THE SAME

(71) Applicant: Temple University—Of The Commonwealth System of Higher Education, Philadelphia, PA (US)

(72) Inventors: Shenqiang Ren, Haverford, PA (US); Simona Percec, Philadelphia, PA (US); Zhuolei Zhang, Philadelphia, PA (US)

(73) Assignee: Temple University-Of The Commonwealth System of Higher Education, Philadelphia, PA (US)

( * ) Notice: Subject to any disclaimer, the term of this patent is extended or adjusted under 35 U.S.C. 154(b) by 1134 days.

(21) Appl. No.: 16/767,496

(22) PCT Filed: Nov. 29, 2018

(86) PCT No.: PCT/US2018/062934
§ 371 (c)(1),
(2) Date: May 27, 2020

(87) PCT Pub. No.: WO2019/108712
PCT Pub. Date: Jun. 6, 2019

(65) Prior Publication Data
US 2020/0354883 A1 Nov. 12, 2020

Related U.S. Application Data

(60) Provisional application No. 62/591,788, filed on Nov. 29, 2017.

(51) Int. Cl.
C23C 16/00 (2006.01)
C23C 16/40 (2006.01)
(Continued)

(52) U.S. Cl.
CPC .......... *D06M 11/45* (2013.01); *C23C 16/403* (2013.01); *C23C 18/122* (2013.01);
(Continued)

(58) Field of Classification Search
CPC . C23C 16/403; C23C 18/122; C23C 18/1254; D06M 11/45; D06M 11/55; D06M 11/79; D06M 2101/36; D06M 2400/02
See application file for complete search history.

(56) References Cited

U.S. PATENT DOCUMENTS 8,741,392 B2 * 6/2014 McCrea .................... C08J 7/12
427/322
2012/0234581 A1 * 9/2012 Ivanov .................. H05K 1/095
977/932

(Continued)

OTHER PUBLICATIONS

Carbajal-de la Torre, et al., Study of Ceramic and hybrid coatings produced by the sol-gel method for corrosion protection, The Open Corrosion Journal, 2009, vol. 2, pp. 197-203.

(Continued)

*Primary Examiner* — Hai Y Zhang
(74) *Attorney, Agent, or Firm* — Riverside Law LLP

(57) ABSTRACT

The present invention relates in part to a method of fabricating a ceramic-polymer composite by contacting a polymer material with an acid solution and depositing a ceramic on the polymer material. The invention also relates in part to ceramic-polymer composites produced using said method and ballistic resistant materials comprising said ceramic-polymer composites.

13 Claims, 16 Drawing Sheets

(51) Int. Cl.
  *C23C 18/12* (2006.01)
  *D06M 11/45* (2006.01)
  *D06M 11/55* (2006.01)
  *D06M 11/79* (2006.01)
  *D06M 101/36* (2006.01)

(52) U.S. Cl.
  CPC ......... *C23C 18/1254* (2013.01); *D06M 11/55* (2013.01); *D06M 11/79* (2013.01); *D06M 2101/36* (2013.01); *D06M 2400/02* (2013.01)

(56) References Cited

U.S. PATENT DOCUMENTS

2017/0000610 A1* 1/2017 Eppihimer ............ A61F 2/2469
2017/0174928 A1* 6/2017 Sigmund ............. D06M 13/517

OTHER PUBLICATIONS

Kong, H., Teng, C., Liu, X., Zhou, J., Zhong, H., Zhang, Y., . . . Yu, M. (2014). Simultaneously improving the tensile strength and modulus of aramid fiber by enhancing amorphous phase in supercritical carbon dioxide. RSC Adv., 4(39), 20599-20604.

Liu, X., & Yu, W. (2005). Evaluating the thermal stability of high performance fibers by TGA. Journal of Applied Polymer Science, 99(3), 937-944.

Mundy, Deposition Processes for Multifunctional Nanocoatings on Polymers, Doctoral dissertation, North Carolina State University, Mar. 2017, 15 pages.

Park, S.-J., Seo, M.-K., Ma, T.-J., & Lee, D.-R. (2002). Effect of Chemical Treatment of Kevlar Fibers on Mechanical Interfacial Properties of Composites. Journal of Colloid and Interface Science, 252(1), 249-255.

Roylance, The Effect of Moisture on the Properties of an Aramid/Epoxy Composite, Army Materials and Mechanics Research Center, Watertown, MA, May 1983, 17 pages.

Zhang et al., Poly [P-Phenylene Terephthalamide] Fibers Reinforced with Ultrathin Ceramic Coatings, Advanced Engineering Materials, 2008, vol. 20,1800095, 6 pages.

Zhang, H., Zhang, J., Chen, J., Hao, X., Wang, S., Feng, X., & Guo, Y. (2006). Effects of solar UV irradiation on the tensile properties and structure of PPTA fiber. Polymer Degradation and Stability, 91(11), 2761-2767.

Zhang, J. M., Mousavi, Z., Soykeabkaew, N., Smith, P., Nishino, T., & Peijs, T. (2010). All-Aramid Composites by Partial Fiber Dissolution. ACS Applied Materials & Interfaces, 2(3), 919-926.

* cited by examiner

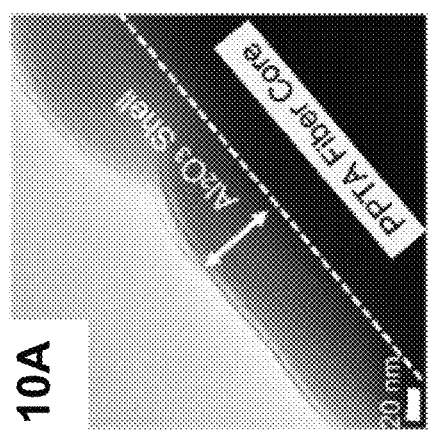
Fig. 10A
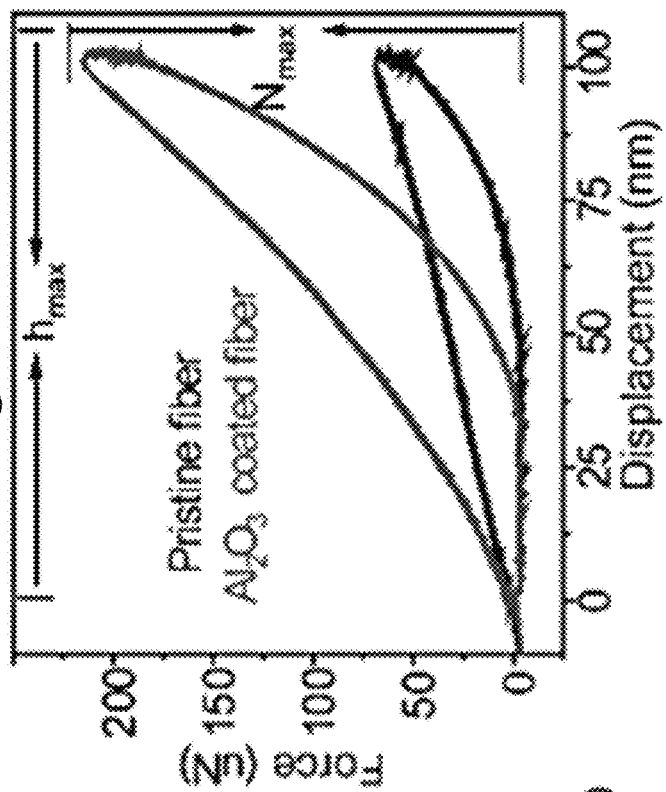
Fig. 10B
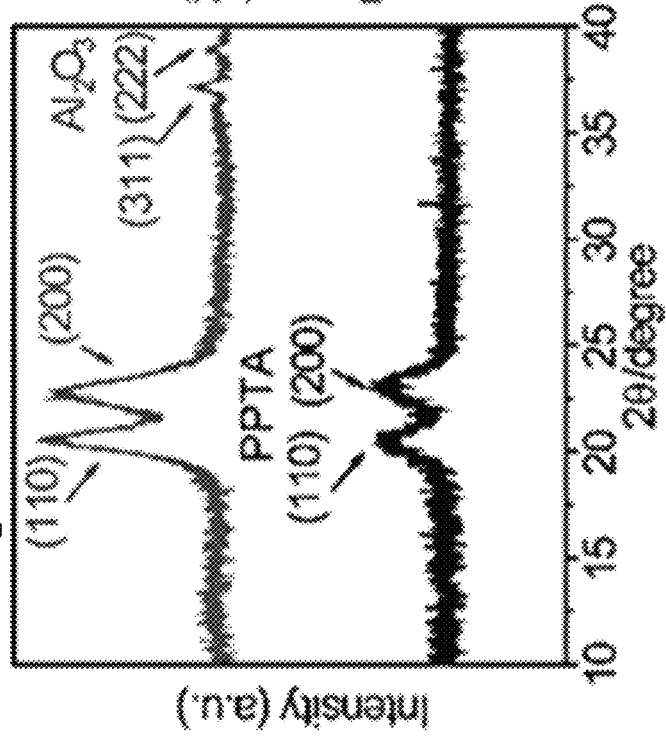
Fig. 10C
Figure 10

CERAMIC-POLYMER COMPOSITES AND METHODS OF MAKING THE SAME

CROSS-REFERENCE TO RELATED APPLICATIONS

The present application is a 35 U.S.C. § 371 national phase application from, and claiming priority to, International Application No. PCT/US2018/062934, filed Nov. 29, 2018, which claims priority under 35 U.S.C. § 119(e) to U.S. Provisional Application No. 62/591,788, filed Nov. 29, 2017, all of which are incorporated herein by reference in their entireties.

STATEMENT REGARDING FEDERALLY SPONSORED RESEARCH OR DEVELOPMENT

This invention was made with government support under W911NF-15-1-0610, and W911NF-16-2-0189 awarded by Army Research Laboratory—Army Research Office. The government has certain rights in the invention.

BACKGROUND OF THE INVENTION

Poly(p-phenylene terephthalamide) (PPTA) fibers have been extensively utilized in engineering polymers (Cunniff, in Proceedings of the 18th international symposium of ballistics, Vol. 1, CRC, Boca Raton, FL, 1999, pp. 814-821; Cunniff, Textile Research Journal, 1996, 66, 45-58; Andreff, Handbook on the Economics of Sport, 2006, 27-39; Fernandez, Material architecture: emergent materials for innovative buildings and ecological construction, Taylor & Francis, 2006), due to their remarkable tensile-strength-to-weight ratio, high modulus and toughness, thermal stability and energy absorption ability (Hearle and Wong, Journal of Materials Science, 1977, 12, 2447-2455; Allen, Journal of Materials Science, 1987, 22, 853-859). The mechanical properties of PPTA fibers are superior to other polymers in which van der Waals interactions dominate (Downing and Newell, Journal of Applied Polymer Science, 2004, 91, 417-424; Rao, et al., Polymer, 2001, 42, 5937-5946). The remarkable mechanical properties of PPTA fibers along the fiber axis are attributed to their high level of molecular orientation and the degree of crystallinity (Gazit, Chemical Society Reviews, 2007, 36, 1263-1269; Penn and Larsen, Journal of Applied Polymer Science, 1979, 23, 59-73). The compressive mechanical properties of PPTA fibers are the result of the aromatic stacking interactions between adjacent polymer backbone and inter-molecular hydrogen bonds with the neighboring —NH groups (Lafitte and Bunsell, Polymer Engineering & Science, 1985, 25, 182-187; Singletary, et al., Journal of Materials Science, 2000, 35, 573-581). However, the PPTA fibers show distinct anisotropic mechanical properties along the longitudinal and transverse directions, particularly a relatively weak compressive mechanical response. Furthermore, under external stimuli, such as UV light, moisture, chemicals, etc., damages of the PPTA structures could occur, resulting in a weakening of their mechanical strength (Liu and Yu, Journal of Applied Polymer Science, 2006, 99, 937-944; Park, et al., Journal of Colloid and Interface Science, 2002, 252, 249-255; Zhang, et al., Polymer Degradation and Stability, 2006, 91, 2761-2767).

Several approaches have been applied to increase the cross-section compressive mechanical properties of PPTA fibers. One method is to increase the crystallinity of PPTA fibers via thermal treatment under tension, like the process applied to transform the commercial fiber Kevlar® 29 to Kevlar® 49. As a result, the polymer chains become more ordered and the orientation of the crystalline orientation raises, which increases the rigidity and Young's modulus. However, the high processing cost and the significant loss in flexibility of the fibers hinder the extensive application of this methodology. Another approach to enhance the mechanical properties of PPTA fibers involves mixing the PPTA fibers with a higher modulus matrix to form composites. The matrix bands the fibers together, which leads to an enhancement of the macro-mechanical properties. However, the increased weight and reduced flexibility of these composites prevents the extended use of this approach.

There is need in the art for PPTA fiber composites with enhanced mechanical properties, and for methods to produce such fiber composites. The present invention satisfies this unmet need.

SUMMARY OF THE INVENTION

In one aspect, the present invention relates to a method of fabricating a ceramic-polymer composite, the method comprising the steps of providing a polymer material; contacting the polymer material with an acid solution; and depositing a ceramic on the polymer material to create ceramic-polymer composite. In one embodiment, the step of providing a polymer material comprises the step of providing a single polymeric fiber, a plurality of polymeric fibers, or a plurality of fibers in the form of a woven or non-woven fabric. In one embodiment, the polymer material comprises a polymer selected from the group consisting of a polyolefin, a polyamide, an aramid, a polycarbonate, a polystyrene, a fluoropolymer, a polyester, an epoxy, a polybenzazole, and combinations or co-polymers thereof. In one embodiment, the polymer material is poly(p-phenylene terephthalamide).

In one embodiment, the step of contacting the polymer with an acid solution further comprises the steps of contacting the polymer material with a neutral solvent; neutralizing the polymer material; and rinsing the polymer material with a neutral solvent. In one embodiment, the step of contacting the polymer material with an acid solution further comprises the step of drying the polymer material. In one embodiment, the acid solution comprises sulfuric acid.

In one embodiment, the step of depositing a ceramic on the polymer material comprises the steps of subjecting the polymer material to a first vapor precursor; and subjecting the polymer material to a second vapor precursor. In one embodiment, the first vapor precursor is selected from the group consisting of trimethylaluminium, tris(diethylamido) aluminum, tris(ethylmethylamido)aluminum, diethylaluminum ethoxide, aluminum sec-butoxide, $AlCl_3$, and $AlBr_3$. In one embodiment, the second vapor precursor is selected from the group consisting of $H_2O$, $O_2$, $O_3$, $N_2O$, $NO_2$, $N_2O_5$, and $H_2O_2$. In one embodiment, the step of depositing a ceramic on the polymer material comprises the steps of: immersing the polymer material in a colloidal suspension of ceramic precursor; and adding a gelation catalyst to the colloidal suspension of ceramic precursor. In one embodiment, the ceramic precursor is selected from the group consisting of tetraethyl orthosilicate, tetramethyl orthosilicate, tetrabutyl orthosilicate, tetrachlorosilane, and sodium silicate. In one embodiment, the gelation catalyst is $NH_4OH$ or HCl.

The present invention also relates in part to a ceramic-polymer composite formed by the methods described herein, a ballistic resistant material comprising the ceramic-polymer composite formed by the methods described herein, or a fabric comprising said ballistic resistant material.

In another aspect, the present invention relates to a ceramic-polymer composite, comprising a polymer material having a plurality of polymer fibers forming a bundle, the bundle having an outer surface, wherein the polymer fibers on the outer surface of the bundle are at least partially fused; and a ceramic shell disposed over at least a portion of the outer surface of the bundle. In one embodiment, the polymer material comprises a polymer selected from the group consisting of polyolefin and aramid. In one embodiment, the ceramic shell comprises a ceramic selected from the group consisting of alumina and silica. In one embodiment, the ceramic-polymer composite is more resistant to degradation than the polymer material.

BRIEF DESCRIPTION OF THE DRAWINGS

The following detailed description of various embodiments of the invention will be better understood when read in conjunction with the appended drawings. For the purpose of illustrating the invention, there are shown in the drawings illustrative embodiments. It should be understood, however, that the invention is not limited to the precise arrangements and instrumentalities of the embodiments shown in the drawings.

FIGS. 2A and 2B, depicts the morphology of pristine PPTA. FIG. 2A is a SEM image of pristine PPTA. FIG. 2B is a transmission electron microscopy (TEM) image of pristine PPTA fiber.

FIGS. 4A-4D, depicts the morphology of coated PPTA fibers. FIG. 4A is a scanning electron microscopy (SEM) image of an alumina-coated PPTA fiber. FIG. 4B is a chemical mapping image of an alumina-coated PPTA fiber. FIG. 4C is a SEM image of a silica-coated PPTA fiber. FIG. 4D is a chemical mapping image of a silica-coated PPTA fiber.

FIGS. 10A-10E, depicts structural characteristics of alumina-coated fibers and corresponding mechanical properties. FIG. 10A is a TEM image of an alumina-coated fiber. FIG. 10B depicts the x-ray diffraction (XRD) pattern of pristine and alumina-coated PPTA fiber. FIG. 10C is a plot of force-displacement curves of pristine and alumina-coated PPTA fiber. FIG. 10D is an extreme property mapping (XPM) image of pristine PPTA fibers. FIG. 10E is an XPM image of alumina-coated PPTA fibers.

FIGS. 11A-11D, depicts the change in mechanical properties over the course of UV and oxidizing agent treatments of pristine and alumina-coated fibers. FIG. 11A is a plot showing the change in the Young's modulus of pristine and alumina-coated fiber over the course of UV treatment. FIG. 11B is a plot showing the change in the hardness of pristine and alumina-coated fiber over the course of UV treatment. FIG. 11C is a plot showing the change in the Young's modulus of pristine and alumina-coated fiber over the course of oxidizing agent treatment. FIG. 11D is a plot showing the change in the hardness of pristine and alumina-coated fiber over the course of UV treatment.

FIGS. 12A-12D, depicts the morphology of acid-treated and alumina-coated PPTA fibers. FIG. 12A is an SEM image of pristine PPTA fibers. FIG. 12B is an SEM image of PPTA fibers after acid treatment. FIG. 12C is an SEM image of acid-treated and alumina-coated PPTA fiber. FIG. 12D is layered mapping image of acid-treated and alumina-coated PPTA fiber.

FIGS. 14A and 14B, depict the mechanical properties of acid-treated and alumina-coated PPTA fibers. FIG. 14A is a graph depicting the Young's modulus of pristine, acid-treated, and acid-treated, alumina-coated PPTA fiber. FIG. 14B is a plot of the cooling of pristine and alumina-coated PPTA. In inset: near-infrared images of pristine and acid-treated, alumina-coated PPTA before (top) and after (bottom) cooling.

DETAILED DESCRIPTION

It is to be understood that the Figures and descriptions of the present invention have been simplified to illustrate elements that are relevant for a clear understanding of the present invention, while eliminating, for the purpose of clarity, many other elements found in composite materials and methods of making. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

As used herein, each of the following terms has the meaning associated with it in this section. Unless defined otherwise, all technical and scientific terms used herein generally have the same meaning as commonly understood by one of ordinary skill in the art to which this invention belongs.

The articles "a" and "an" are used herein to refer to one or to more than one (i.e. to at least one) of the grammatical object of the article. By way of example, "an element" means one element or more than one element.

As used herein, the term "about" will be understood by persons of ordinary skill in the art and will vary to some extent depending on the context in which it is used. As used herein when referring to a measurable value such as an amount, a temporal duration, and the like, the term "about" is meant to encompass variations of ±20% or ±10%, more preferably ±5%, even more preferably ±1%, and still more preferably ±0.1% from the specified value, as such variations are appropriate to perform the disclosed methods.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

DESCRIPTION

Figure 1:
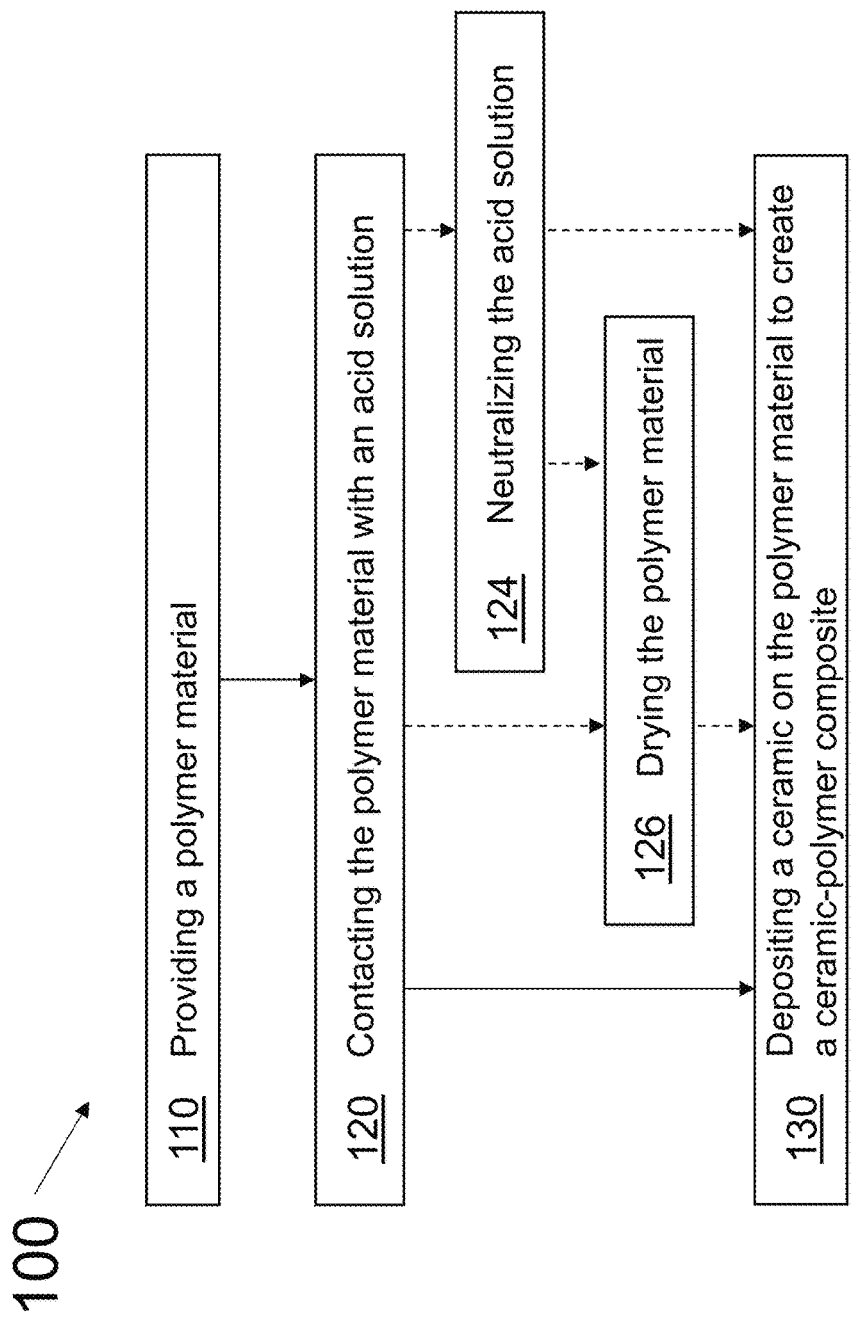
FIG. 1 is a flowchart of an exemplary method for the fabrication of a ceramic-polymer composite material.

In one aspect, the invention relates to a method of producing a polymer composite material. Exemplary process 100 is shown in FIG. 1. In step 110, a polymer material is provided. In step 120, the polymer material is contacted with an acid solution. In step 130, a ceramic material is deposited on the polymer material to create a ceramic-polymer composite.

In step 110, there is no limitation to the type of polymer material provided. In one embodiment, the polymer material comprises a single polymeric fiber. In one embodiment, the polymer material comprises a plurality of polymeric fibers. In one embodiment, the polymer material comprises a plurality of fibers in the form of a woven fabric or a non-woven fabric.

The polymer material may comprise any polymer. Exemplary polymer materials include, but are not limited to, polyolefin fibers such as high density and low density polyethylene, extended chain polyolefin fibers, high molecular weight polyethylene fibers, ultra-high molecular weight polyethylene fibers, polypropylene fibers, ultra-high molecular weight polypropylene fibers; aramid fibers such as para-aramid fibers, polyamide fibers, polyimide fibers, and polyamide-imide fibers;

polycarbonate polybutylene fibers; polystyrene fibers; polyester fibers such as polyethylene terephthalate fibers, polyethylene naphthalate fibers, and polycarbonate fibers; polyacrylate fibers; polybutadiene fibers; polyurethane fibers; extended chain polyvinyl alcohol fibers; fibers formed from fluoropolymers such as polytetrafluoroethylene (PTFE); epoxy fibers; phenolic resin polymeric fibers; polyvinyl chloride fibers; organosilicon polymeric fibers; extended chain polyacrylonitrile fibers; polybenzazole fibers such as polybenzoxazole (PBO) and polybenzothiazole (PBT) fibers; liquid crystal copolyester fibers; rigid rod fibers such as M5® fibers; and combinations thereof. In some embodiments of the invention, the polymer material comprises a copolymer or a block copolymer. In one embodiment, the polymer material is thermoplastic or thermosetting.

In one embodiment, the polymer material is a high-strength, high tensile modulus fibers such as may be used in the manufacture of ballistic resistant fabrics by one of skill in the art. Exemplary polymeric fibers useful for the formation of ballistic resistant fabrics include, but are not limited to, polyethylene, particularly extended chain polyethylene fibers, aramid fibers, polybenzazole fibers, liquid crystal copolyester fibers, polypropylene fibers, particularly highly oriented extended chain polypropylene fibers, polyvinyl alcohol fibers, polyacrylonitrile fibers and rigid rod fibers, particularly M5® fibers.

In one embodiment, the polymer material comprises extended chain polyethylenes having molecular weights of at least 500,000, at least one million or between two million and five million. Such extended chain polyethylene (ECPE) fibers may be grown in solution spinning processes such as described in U.S. Pat. No. 4,137,394 or 4,356,138, which are incorporated herein by reference, or may be spun from a solution to form a gel structure, such as described in U.S. Pat. Nos. 4,551,296 and 5,006,390, which are also incorporated herein by reference. In one embodiment, the polymer material comprises polyethylene fibers sold under the trademark SPECTRA® from Honeywell International Inc. SPECTRA® fibers are well known in the art and are described, for example, in U.S. Pat. Nos. 4,623,547 and 4,748,064.

In one embodiment, the polymer material comprises aramid (aromatic polyamide) or para-aramid fibers. In one embodiment, the aramid fibers are commercially available, such as those described in U.S. Pat. No. 3,671,542. In one embodiment, the polymer material comprises poly(p-phenylene terephthalamide) filaments produced commercially by DuPont Corporation under the trade name of KEVLAR®. In one embodiment, the polymer material comprises poly(m-phenylene isophthalamide) fibers produced commercially by DuPont under the trade name NOMEX® and or produced commercially by Teijin under the trade name TWARON®.

In one embodiment, the polymer material comprises polybenzazole fibers, for example those described in U.S. Pat. Nos. 5,286,833, 5,296,185, 5,356,584, 5,534,205 and 6,040,050, each of which are incorporated herein by reference. In one embodiment, the polybenzazole fibers are ZYLON® brand fibers from Toyobo Co. In one embodiment, the polymer material comprises liquid crystal copolyester fibers such as those described, for example, in U.S. Pat. Nos. 3,975,487; 4,118,372 and 4,161,470, each of which is incorporated herein by reference.

In one embodiment, the polymer material comprises polypropylene fibers. In one embodiment, the polymer material comprises highly oriented extended chain polypropylene (ECPP) fibers as described in U.S. Pat. No. 4,413,110, which is incorporated herein by reference. In one embodiment, the polymer material comprises polyvinyl alcohol (PV-OH) fibers such as those described, for example, in U.S. Pat. Nos. 4,440,711 and 4,599,267 which are incorporated herein by reference. In one embodiment, the polymer material comprises polyacrylonitrile (PAN) fibers such as those described, for example, in U.S. Pat. No. 4,535,027, which is incorporated herein by reference.

In one embodiment, the polymer material comprises rigid rod fibers. In one embodiment, the polymer material comprises M5® fibers. M5® fibers are manufactured by Magellan Systems International of Richmond, Va. and are described, for example, in U.S. Pat. Nos. 5,674,969, 5,939, 553, 5,945,537, and 6,040,478, each of which is incorporated herein by reference.

In one embodiment, the polymer material comprises a combination of at least two types of polymers. In one non-limiting example, the polymer material may comprise fibrous layers formed from a combination of SPECTRA® fibers and Kevlar® fibers.

In step 120, contacting the polymer material with the acid solution facilitates the deposition of the ceramic. While not wishing to be bound by any one theory, it is possible that contacting the polymer material with the acid solution causes the surfaces of the fibers to become partially dissolved, allowing the fusion of fibers. In one embodiment, contacting the polymer material with the acid solution results in self-reinforced structures. In one embodiment, contacting the polymer material with the acid solution promotes a progressive formation of the matrix and the interphase, which facilitate the transfer of stress between the fibers.

The acid solution comprises any mineral acid or organic acid or mixture thereof known to those of skill in the art. In one embodiment, the acid solution comprises a strong acid. Exemplary acids include, but are not limited to, sulfuric acid, perchloric acid, hydrochloric acid, hydrobromic acid, hydroiodic acid, acetic acid, formic acid, chloric acid, p-toluenesulfonic acid, methanesulfonic acid, fluorosulfuric acid, trifluoromethanesulfonic acid, phosphoric acid, nitric acid, perbromic acid, periodic acid, benzenesulfonic acid, hydrogen fluoride, and combinations thereof. In some embodiments, the acid solution further comprises a solvent selected from the group consisting of water, methanol, ethanol, diethyl ether, and tetrahydrofuran.

The acid solution may comprise between 0.1% and 100% acid. In one embodiment, the acid solution comprises at least about 50% acid. In one embodiment, the acid solution comprises at least about 60% acid. In one embodiment, the acid solution comprises at least about 70% acid. In one embodiment, the acid solution comprises at least about 80% acid. In one embodiment, the acid solution comprises at least about 90% acid. In one embodiment, the acid solution comprises at least about 98% acid. In one embodiment, the acid solution comprises at least about 100% acid. In one embodiment, the acid solution is a concentrated solution.

The polymer material may be contacted with the acid solution using any method known to those of skill in the art. In one embodiment, the polymer material is immersed in the acid solution. In one embodiment, the polymer material is coated with the acid solution. In one embodiment, one side of the polymer material is contacted with the acids solution. In one embodiment, the totality of the polymer material is contacted with the acid solution. In one embodiment, individual fibers of the polymer material are contacted with the acid solution. In one embodiment, whole fabrics of the polymer material are contacted with the acid solution.

The length of time for which the polymer material is contacted with the acid solution may differ depending on the polymer material and/or the acid employed. In one embodiment, the polymer material is contacted with the acid solution for between 1 and 30 seconds. In one embodiment, the polymer material is contacted with the acid solution for no more than 1, 2, 5, 10, 15, or 30 seconds. In one embodiment, the polymer material is contacted with the acid solution for about 10 seconds. In one embodiment, the polymer material is contacted with the acid solution for at least 30 seconds. In one embodiment, the polymer material is contacted with the acid solution for at least about 1, 2, 5, 10, 15, or 30 minutes In some embodiments, the step of contacting the polymer material with the acid solution further comprises the step of contacting the polymer material with a neutral solvent such as water. In one embodiment, the polymer material is rinsed with water. In one embodiment, the polymer material is immersed in water. In one embodiment, the step of contacting the polymer material with a neutral solvent coagulates the fibers of the polymer material.

In some embodiments, the step of contacting the polymer material with the acid solution further comprises step 124, wherein the acid solution is neutralized such as by using a base solution. In one embodiment, the step of contacting the polymer material with the acid solution further comprises the step of contacting the polymer material sequentially with a neutral solution, a base solution, and a neutral solvent.

The base solution comprises any mineral base or organic base or mixture thereof known to those of skill in the art. In one embodiment, the base solution comprises a strong base. Exemplary bases include, but are not limited to, NaOH, KOH, NaOtBu, KOtBu, and combinations thereof. In some embodiments, the base solution further comprises a solvent selected from the group consisting of water, methanol, ethanol, diethyl ether, and tetrahydrofuran.

The base solution may comprise between 0.1% and 100% base. In one embodiment, the base solution comprises at least about 50% base. In one embodiment, the base solution comprises at least about 60% base. In one embodiment, the base solution comprises at least about 70% base. In one embodiment, the base solution comprises at least about 80% base. In one embodiment, the base solution comprises at least about 90% base. In one embodiment, the base solution comprises at least about 98% base. In one embodiment, the base solution comprises at least about 100% base. In one embodiment, the base solution is a concentrated solution.

The polymer material may be contacted with the base solution using any method known to those of skill in the art. In one embodiment, the polymer material is immersed in the base solution. In one embodiment, the polymer material is coated with the base solution. In one embodiment, one side of the polymer material is contacted with the base solution. In one embodiment, the totality of the polymer material is contacted with the base solution. In one embodiment, individual fibers of the polymer material are contacted with the base solution. In one embodiment, whole fabrics of the polymer material are contacted with the base solution.

In some embodiments, the step of contacting the polymer material with the acid solution further comprises step 126, wherein the polymer material is dried. In one embodiment, the polymer material is dried in an oven. In one embodiment, the polymer material is dried in a vacuum oven. In one embodiment, the polymer material is dried in a low-pressure oven. In one embodiment, drying the polymer material in a low-pressure oven prevents warping of the polymer material. In one embodiment, the polymer material is dried at a temperature of at least 30° C. In one embodiment, the polymer material is dried at a temperature of at least 40° C. In one embodiment, the polymer material is dried at a temperature of at least 50° C. In one embodiment, the polymer material is dried at a temperature of at least 60° C. In one embodiment, the polymer material is dried at a temperature of at least 70° C. In one embodiment, the polymer material is dried at a temperature of at least 80° C. In one embodiment, the polymer material is dried at a temperature of at least 90° C. In one embodiment, the polymer material is dried at a temperature of at least 100° C. In one embodiment, the polymer material is dried for at least about 6 h. In one embodiment, the polymer material is dried for at least about 12 h. In one embodiment, the polymer material is dried for at least about 18 h. In one embodiment, the polymer material is dried for at least about 24 h.

In step 130, the ceramic material may be deposited using any technique known to those of skill in the art, including, but not limited to, a deposition process, such as chemical vapor deposition (CVD), physical vapor deposition (PVD), or a cyclical deposition process, for example, such as atomic layer deposition (ALD), or the like. In some embodiments of the invention, the ceramic material is deposited using atomic layer deposition (ALD). In other embodiments, the ceramic material is deposited using a sol-gel process. In one embodiment, the polymer material exhibits no change in morphology upon deposition of ceramic. In one embodiment, the polymer material exhibits no structural damage upon deposition of ceramic. In one embodiment, the polymer material exhibits no degradation upon deposition of ceramic.

In one embodiment, the ceramic is deposited using ALD. As is well known in the art, ALD is similar in chemistry to chemical vapor deposition (CVD), except that an ALD reaction essentially breaks the CVD reaction into two halfreactions, keeping the precursor materials separate during the reaction. Atomic layer deposition may be conducted in a variety of different reaction vessels, using various different reaction precursors and purge gases. Reaction temperatures and pressures may vary depending on both the material being deposited as well as the substrate type. For the purposes of this invention, any known variation of atomic layer deposition may be conducted as long as it is sufficient to form a polymer-composite material without degrading the entire polymer. In one embodiment, the reactants can cover all surfaces of the substrate, even if those surfaces are not in the direct path of the precursors as they are brought into the reaction chamber. In one embodiment, atomic layer deposition will only coat exposed substrate surfaces that can be reached by the precursor compositions.

In one embodiment, the polymer material is placed into a suitable reaction vessel, particularly a chamber or reaction tube that is capable of being evacuated and maintained at sub-atmospheric pressure. In one embodiment, the reaction is conducted under a vacuum. Examples of suitable of reactors used for the deposition of ceramics include any commercially available ALD equipment, including F-120, F-120 SAT and PULSAR® reactors produced by ASM Microchemistry Ltd. of Finland, and the P400A made by Planar Systems Inc. of Finland. In addition to these ALD reactors, many other kinds of reactors capable for ALD growth of ceramics, including rotary tube reactors and CVD reactors equipped with appropriate equipment and means for pulsing the precursors, can be utilized.

In one embodiment, these materials are deposited as the reaction product from the reaction of a first vapor precursor with a second vapor precursor. In one embodiment, molecules of the first precursor react with and are chemisorbed by the polymer material at its surface, and molecules of the second precursor react with molecules of the first precursor. Useful vaporizable first precursors non-exclusively include trimethylaluminum (TMA), titanium isopropoxide, pentakis(dimethylamino)tantalum, tetrakis(diethylamido)hafnium (IV), tetrakis(dimethylamido)hafnium(IV), tetrakis(ethylmethylamido)hafnium(IV), hafnium(IV) chloride, hafnium (IV) tert-butoxide, diethylaluminum ethoxide, aluminum sec-butoxide, tris(diethylamido)aluminum, tris(ethylmethylamido)aluminum, bis(N,N'-di-tert-butylacetamidinato)iron(II), bis(N,N'-diisopropylacetamidinato)nickel(II), bis(N,N'-diisopropylacetamidinato)cobalt(II), bis(cyclopentadienyl)magnesium(II), bis(pentamethylcyclopentadienyl)magnesium(II), molybdenum hexacarbonyl, molybdenum hexafluoride, bis(methylcyclopentadienyl)nickel(II), dimethoxydimethylsilane, methyl silane, di silane, 2,4,6,8-tetramethylcyclotetrasiloxane, tris(tert-butoxy)silanol, tris(diethylamido)(tert-butylimido)tantalum(V), bis(diethylamino)bis(diisopropylamino) titanium(IV), tetrakis(diethylamido) titanium(IV), tetrakis(dimethylamido)titanium(IV), tetrakis(ethylmethylamido) titanium(IV), bis(tert-butylimido)bis(dimethylamido) tungsten(VI), tungsten hexacarbonyl, tris(N,N-bis(trimethylsilyl)amide)yttrium(III), yttrium(III) tris(2,2,6,6-tetramethyl-3,5-heptanedionate), tris(cyclopentadienyl)yttrium, tris(butylcyclopentadienyl)yttrium, diethylzinc, tetrakis(diethylamido)zirconium(IV), tetrakis(dimethylamido) zirconium(IV), tetrakis(ethylmethylamido)zirconium(IV), zirconium tetrakis(2,2,6,6-tetramethyl-3,5-heptanedionate), bis(pentamethylcyclopentadienyl)cobalt(II), bis(ethylcyclopentadienyl)cobalt(II), cobalt tris(2,2,6,6-tetramethyl-3,5-heptanedionate), bis(pentamethylcyclopentadienyl)chromium(II), bis(cyclopentadienyl)vanadium(II), vanadyl acetylacetonate, tungsten hexafluoride, bis(cyclopentadienyl)tungsten dichloride, bis(cyclopentadienyl)tungsten dihydride, $SiCl_4$, $AlCl_3$, Tab, $TaF_5$, $SnI_4$, chromyl chloride, copper(II) dialkylamino-2-propoxides, tris[bis(trimethylsilyl)amido]lanthanum, $Ga(N_3)_2Et$, $TiCl_4$, praseodymium alkoxide, $Pt(C_2H_5C_5H_4)(CH_3)_3$, $Pt(acac)_2$ ("acac"=acetylacetonate ligand), molybdenum(V) chloride, zinc bis(O-ethylxanthate), copper(II)(tmhd)$_2$ (tmhd=2,2,6,6-tetramethyl-3,5-heptanedionate), bis(cyclopentadienyl) ruthenium(II) (commonly referred to as $Ru(Cp)_2$), bis(ethyl cyclopentadienyl) ruthenium(II) (commonly referred to as $Ru(EtCp)_2$), (2,4-dimethylpentadienyl)(ethylcyclopentadienyl)Ru, tris(2,4-pentanedionato)iridium, $Ru(thd)_3$ (thd=2,2,6,6-tetramethyl-3,5-heptanedionate), (methylcyclopentadienyl)trimethylplatinum, hexafluoroacetylacetonato (trimethylsilylethylene)copper, Cu(II) (diketiminate)$_2$, cyclopentadienylallyl nickel, Rh(acetylacetonate)$_3$, Pd(hexafluoroacetonylacetonate)$_2$, Pd(2,2,6,6-tetramethyl-3,5-heptanedione)$_2$, methylcyclopentadienyl trimethyl platinum, $Ga_2(NMe_2)_6$, $[(CH_3)_2GaNH_3]_3$, $Er(thd)_3$, bis(2,2,6,6-tetramethyl-3,5-heptanedionato)Sr, $Pb(thd)_2$, $Pb(C_2H_5)_4$, $(CpCH_3)_3Gd$, bis-dipivaloylmethanato-barium $(Ba(thd)_2)$ and $InCl_3$, rare earth precursors with β-diketonate-type ligands, including β-diketonate-type $Ln(thd)_3$ materials, which include $Gd(thd)_3$ and $Er(thd)_3$, as well as thd mixed with other ligands.

In one embodiment, the first vapor precursor is selected from the group consisting of trimethylaluminum, titanium isopropoxide, pentakis(dimethylamino)tantalum, tetrakis(diethylamido)hafnium(IV), tetrakis(dimethylamido)hafnium(IV), tetrakis(ethylmethylamido)hafnium(IV), hafnium (IV) chloride, tris(diethylamido)aluminum, tris(ethylmethylamido)aluminum, bis(N,N'-di-tert-butylacetamidinato)iron(II), bis(N,N'-diisopropylacetamidinato)nickel(II), bis(N,N'-diisopropylacetamidinato)cobalt(II), bis(cyclopentadienyl) magnesium(II), bis(methylcyclopentadienyl)nickel(II), dimethoxydimethylsilane, methyl silane, di silane, tris(tert-butoxy)silanol, tris(diethylamido)(tert-butylimido)tantalum (V), bis(diethylamino)bis(diisopropylamino)titanium(IV), tetrakis(diethylamido)titanium(IV), tetrakis(dimethylamido)titanium(IV), tetrakis(ethylmethylamido)titanium (IV), bis(tert-butylimido)bis(dimethylamido) tungsten(VI), yttrium(III) tris(2,2,6,6-tetramethyl-3,5-heptanedionate), tris(cyclopentadienyl)yttrium, tris(butylcyclopentadienyl) yttrium, diethylzinc, tetrakis(diethylamido)zirconium(IV), tetrakis(dimethylamido) zirconium(IV), tetrakis(ethylmethylamido) zirconium(IV), zirconium tetrakis(2,2,6,6-tetramethyl-3,5-heptanedionate), bis(pentamethylcyclopentadienyl)cobalt(II), bis(ethylcyclopentadienyl)cobalt(II), bis(pentamethylcyclopentadienyl)chromium(II), bis(cyclopentadienyl)vanadium(II), vanadyl acetylacetonate, tungsten hexafluoride, tungsten hexafluoride, $SiCl_4$, $AlCl_3$, $TaI_5$, $TaF_5$, $SnI_4$, chromyl chloride, copper(II) dialkylamino-2-propoxides, tris[bis(trimethylsilyl)amido]lanthanum, $Ga(N_3)_2Et$, $TiCl_4$, praseodymium alkoxide, $Pt(C_2H_5C_5H_4)(CH_3)_3$, $Pt(acac)_2$, molybdenum(V) chloride, zinc bis(O-ethylxanthate), $Cu(II)(tmhd)_2$, $Ru(Cp)_2$, $Ru(EtCp)_2$, (2,4-dimethylpentadienyl)(ethylcyclopentadienyl)Ru, tris(2,4-pentanedionato)iridium, $Ru(thd)_3$, (methylcyclopentadienyl)trimethylplatinum, hexafluoroacetylacetonato(trimethylsilylethylene)copper, Cu(II) (diketiminate)$_2$, cyclopentadienylallylnickel, Rh(acetylacetonate)$_3$, Pd(hexafluoroacetonylacetonate)$_2$, Pd(2,2,6,6-tetramethyl-3,5-heptanedione)$_2$, methylcyclopentadienyl trimethyl platinum, $Ga_2(NMe_2)_6$, $[(CH_3)_2GaNH_3]_3$, bis(2,2,6,6-tetramethyl-3,5-heptanedionato)Sr, $Pb(thd)_2$, $Pb(C_2H_5)_4$, $(CpCH_3)_3Gd$, $(Ba(thd)_2)$, $InCl_3$, rare earth pre cursors with β-diketonate-type ligands including Gd(thd)$_3$ and Er(thd)$_3$, and combinations thereof. In one embodiment, the first precursor is useful for producing a silicon oxide, titanium oxide, tantalum oxide, aluminum oxide, hafnium oxide, zirconium oxide, titanium aluminate, titanium silicate, hafnium aluminate, hafnium silicate, zirconium aluminate, zirconium silicate, boron nitride reaction product, or combinations thereof. In one embodiment, the first precursor is useful for producing an aluminum oxide. In one embodiment, the first precursor is selected from the group consisting of trimethylaluminium, tris(diethylamido)aluminum, tris(ethylmethylamido)aluminum, diethylaluminum ethoxide, aluminum sec-butoxide, AlCl$_3$, and AlBr$_3$. In one embodiment, the first precursor is trimethylaluminum.

Exemplary second vapor precursors include, but are not limited to, H$_2$O (as water vapor), O$_2$, O$_3$, nitrous oxide (N$_2$O), nitric oxide (NO), nitrogen dioxide (NO$_2$), nitrogen pentoxide (N$_2$O$_5$), NH$_3$, Na, H$_2$, diborane, H$_2$O$_2$, triphenylborane, H$_2$S and methane. In one embodiment, the second vapor precursor is selected from the group consisting of H$_2$O, O$_2$, O$_3$, N$_2$O, NO$_2$, N$_2$O$_5$, and H$_2$O$_2$. In one embodiment, the second precursor is H$_2$O. In one embodiment, the first and second vapor precursors exhibit include high vapor pressure, thermal stability prior to deposition, ease of handling and transfer, the ability to chemisorb to a polymer material surface, aggressive reaction with complementary precursors, non-corrosivity toward the polymer material, high purity, and minimally hazardous by-products. Both the first and second vapor precursors should be gases at the temperature at which the reactions are conducted. In one embodiment, the first and second vapor precursors have vapor pressures of at least about 0.1 Torr or greater at a temperature of about room temperature to about 150° C. In one embodiment, the reactants are selected such that they can engage in the reactions that form the desired material at the temperatures stated above. In one embodiment, a catalyst is used to promote the reactions at the required temperatures.

In one embodiment, ALD is performed using a reactor vessel. In one embodiment, the ALD reactor vessel is evacuated and then back-filled with an inert gas such as Ar or N$_2$. In one embodiment, the reactor pressure is maintained at between 0.05 torr and 1 torr. In one embodiment, the reactor pressure is maintained at about 0.13 torr. In one embodiment, the reactor temperature is maintained at between about 25° C. and 400° C. In one embodiment, the reactor temperature is below the temperature at which the polymer material is known by one of skill in the art to melt or degrade. In one embodiment, the reactor temperature is maintained at about 200° C.

In one embodiment, one cycle of ALD comprises the steps of introducing a first vapor precursor into the reactor vessel, removing excess unreacted first vapor precursor from the reactor vessel, introducing a second vapor precursor into the reactor vessel, and removing excess unreacted second vapor precursor from the reactor vessel. In one embodiment, one cycle of ALD deposits a single Angstrom (0.1 nm) layer of ceramic onto the polymer material. In one embodiment, the thickness of the ceramic layer on the polymer material can be controlled by careful selection of the number of ALD cycles. In some embodiments, the number of ALD cycles is between 1 and 10,000. In one embodiment, the number of ALD cycles is between 10 and 1,000. In one embodiment, the number of ALD cycles is between 100 and 1,000. In one embodiment, the number of ALD cycles is about 100. In one embodiment, the number of ALD cycles is about 200. In one embodiment, the number of ALD cycles is about 300. In one embodiment, the number of ALD cycles is about 400. In one embodiment, the number of ALD cycles is about 500. In one embodiment, the number of ALD cycles is about 600. In one embodiment, the number of ALD cycles is about 700. In one embodiment, the number of ALD cycles is about 800. In one embodiment, the number of ALD cycles is about 900. In one embodiment, the number of ALD cycles is about 1000.

In one embodiment, the ceramic is deposited using sol-gel methods. In one embodiment, the step of depositing the ceramic on the polymer material comprises the steps of providing a solution or suspension comprising ceramic precursor (i.e., a "sol"), immersing the polymer material in the sol, and adding a gelation catalyst to the sol, whereby the ceramic precursor is converted to the ceramic on the surface of the polymer material to form a ceramic-polymer composite.

In one embodiment, a sol is provided. In one embodiment, a sol is a colloidal suspension of precursor(s). In some embodiments, precursors may include compounds such as, but not limited to, metal alkoxide, metal acetylacetonate (acac), metal halide, metal carbonyl compound, metal salts of metals such as Al, Ti, V, Mn, Fe, Co, Ni, Cu, Zn, Ga, Y, Zr, Sn, Ce, lanthanoids, or metalloids such as B, Si, Ge, As, Sb, and Te.

In one embodiment, the sol comprises a silica precursor. Exemplary silica precursors include, but are not limited to, TEOS (tetraethyl orthosilicate), TMOS (tetramethyl orthosilicate), TBOS (tetrabutyl orthosilicate), silicon halides such as SiCl$_4$ (tetrachlorosilane), silicon salts such as sodium silicate, and the like. In one embodiment, the sol comprises tetraethoxysilane. In one embodiment, the sol further comprises a diluent such as an aliphatic alcohol, water, ether, ketone, or combination thereof. In one embodiment, the diluent adjusts the viscosity or other parameters of the sol. In one embodiment, the diluent comprises water. In one embodiment, the diluent comprises ethanol.

In one embodiment, the concentration of precursor in diluent can be any value between 0.001% to 100% v/v. In one embodiment, the concentration of precursor is between 0.001% and 50% v/v. In one embodiment, the concentration of precursor is between 0.01% and 25% v/v. In one embodiment, the concentration of precursor is between 0.1% and 10% v/v. In one embodiment, the concentration of precursor is between 1% and 5% v/v. In one embodiment, the concentration of precursor is about 1.0% v/v. In one embodiment, the concentration of precursor is about 1.5% v/v. In one embodiment, the concentration of precursor is about 2.0% v/v. In one embodiment, the concentration of precursor is about 2.5% v/v. In one embodiment, the concentration of precursor is about 3.0% v/v. In one embodiment, the concentration of precursor is about 3.5% v/v. In one embodiment, the concentration of precursor is about 4.0% v/v. In one embodiment, the concentration of precursor is about 4.5% v/v. In one embodiment, the concentration of precursor is about 5.0% v/v. In one embodiment, the concentration of precursor is about 5.5% v/v. In one embodiment, the concentration of precursor is about 6.0% v/v. In one embodiment, the concentration of precursor is about 6.5% v/v. In one embodiment, the concentration of precursor is about 7.0% v/v. In one embodiment, the concentration of precursor is about 7.5% v/v. In one embodiment, the concentration of precursor is about 8.0% v/v. In one embodiment, the concentration of precursor is about 8.5% v/v. In one embodiment, the concentration of precursor is about 9.0% v/v. In one embodiment, the concentration of precursor is about 9.5% v/v. In one embodiment, the concentration of precursor is about 10.0% v/v.

In one embodiment, a gelation catalyst is added to the sol. In some embodiments, the gelation catalyst is an acid. Exemplary acids used for gelation include acetic acid, sulfuric acid, nitric acid, hydroiodic acid, hydrobromic acid, hydrochloric acid, and hydrofluoric acid. In other embodiments, the gelation catalyst is a base. Exemplary bases used for gelation include ammonium hydroxide ($NH_4OH$). In one embodiment, the gelation catalyst is $NH_4OH$.

In one embodiment, the resulting ceramic-polymer composite is dried under vacuum to remove moisture. In one embodiment, the ceramic-polymer composite is dried under vacuum to increase crystallinity. In one embodiment, the ceramic-polymer composite is dried at a temperature above about 20° C. In one embodiment, the ceramic-polymer composite is dried at a temperature about 40° C., about 60° C., about 80° C., about 100° C., about 120° C., about 140° C., about 160° C., about 180° C., or about 200° C. In one embodiment, the ceramic-polymer composite is dried at a temperature of about 140° C.

Ceramic-Polymer Composites

The present invention relates in part to novel ceramic-polymer composite materials formed using the methods described herein. The instant invention is in part based on the unexpected discovery that treatment of a polymer material with an acid prior to deposition on a ceramic results in a ceramic-polymer composite with improved Young's modulus, hardness, and/or thermal conductivity.

In one embodiment, the ceramic-polymer composite comprises a polymer material having a plurality of polymer fibers forming a bundle, the bundle having an outer surface, wherein the polymer fibers on the outer surface of the bundle are at least partially fused; and a ceramic shell disposed over at least a portion of the outer surface of the bundle. The polymer material can comprise any polymer discussed herein.

In one embodiment, the polymer material comprises a single polymeric fiber. In one embodiment, the polymer material comprises a plurality of polymeric fibers forming a bundle. In one embodiment, the polymer material comprises a plurality of fibers in the form of a woven fabric or a non-woven fabric. In one embodiment, the woven fabric or non-woven fabric has an outer surface.

In one embodiment, the single polymeric fiber has any diameter known to one of skill in the art. Exemplary fiber diameters include, but are not limited to, 100 nm to 100 µm.

In one embodiment, the bundle has an outer surface. In one embodiment, the bundle has a solvent-accessible surface. In one embodiment, the outer surface of the bundle comprises the solvent-accessible surface. In one embodiment, the chemical composition of outer surface of the bundle is different from the region of the bundle not comprising the outer surface. In one embodiment, the polymer fibers on the outer surface of the bundle are at least partially fused. In one embodiment, the polymer fibers on the outer surface of the bundle are completely fused. In one embodiment, the polymer fibers on the solvent-accessible surface of the bundle are at least partially fused. In one embodiment, the polymer fibers on the outer surface of the bundle form self-reinforced structures. In one embodiment, the degree of fusion of the polymer fibers is higher closer to the outer surface of the bundle.

The ceramic-polymer composite comprises a ceramic shell disposed over at least a portion of the outer surface of the bundle. In one embodiment, the ceramic shell is disposed over the entire surface of the bundle. In one embodiment, the ceramic shell is disposed over the solvent-accessible surface of the bundle. In one embodiment, the ceramic shell is disposed over one face of the bundle. In one embodiment, the ceramic shell is disposed over multiple faces of the bundle.

In one embodiment, the ceramic shell comprises a ceramic. The ceramic may be any ceramic known to one of skill in the art. Exemplary ceramics include, but are not limited to, oxides such as $Al_2O_3$, $SiO_2$, $Ta_2O_5$, $ZrO_2$, $HfO_2$, ZnO, $TiO_2$, MgO, $Cr_2O_3$, $Co_2O_3$, NiO, FeO, $Fe_2O_3$, $Ga_2O_3$, $GeO_2$, $V_2O_5$, $Y_2O_3$, rare earth oxides, CaO, $In_2O_3$, $SnO_2$, PbO, $PbO_2$, $MoO_3$, and $WO_3$; nitrides such as TiN, TaN, $Si_3N_4$, AlN, $Hf_3N_4$, $Zr_3N_4$, $WN_x$ (wherein x=0.1-2.0), BN, carbon nitride, and alloys and nanolaminates thereof; carbides such as SiC, TiC, boron carbide, WC, $W_2C$, $Fe_3C$, TaC, HfC, ZrC, MoC, and alloys and nanolaminates thereof; silicides such as NiSi, $WSi_2$, $CoSi_2$ and $TiSi_2$; borides such as $TiB_2$, WB and $MgB_2$; sulfides such as $WS_2$, $MoS_2$, copper sulfide, $CaS_2$, and $La_2S_3$; and ternary compounds such as TiCN, TiON, tungsten carbonitride, titanium aluminum nitride, $SrTiO_3$, $La_2O_2S$ and $LaAlO_3$. Combinations of the above materials may be deposited as alloys or as nanolaminates, where a nanolaminate is a thin film composed of a series of alternating sub-layers with different compositions, such as $Al_2O_3$ and $Ta_2O_5$, each being deposited by ALD with their corresponding first and second precursors. Useful alloys non-exclusively include Hf—Si—O, Hf—Al—O, Ru—Cu, Ta—Al—O and Ti—Al—O, which alloys can be formed by co-pulsing or mixing two metal containing precursors. Useful nanolaminates non-exclusively include $HfO_2$—$Al_2O_3$, $HfO_2$—$SiO_2$, Ru—Pt, $ZrO_2$—$Al_2O_3$, $ZrO_2$—$SiO_2$ and $Al_2O_3$—$SiO_2$. In some embodiments, the ceramic material comprises silicon oxide (silica), titanium oxide, aluminum oxide (alumina), tantalum oxide, hafnium oxide, zirconium oxide, titanium aluminate, titanium silicate, hafnium aluminate, hafnium silicate, zirconium aluminate, zirconium silicate, boron nitride or combinations thereof. In one embodiment, the ceramic is silica or alumina. In one embodiment, the ceramic is alumina. In one embodiment, the ceramic is silica.

In one embodiment, the thickness of the ceramic shell is controlled using the methods of the present invention. In one embodiment, the thickness of the ceramic shell is between about 0.1 nm and 1,000 nm. In one embodiment, the thickness of the ceramic shell is between about 1 nm and 100 nm. In one embodiment, the thickness of the ceramic shell is between about 10 and 100 nm. In one embodiment, the thickness of the ceramic shell is about 10 nm. In one embodiment, the thickness of the ceramic shell is about 20 nm. In one embodiment, the thickness of the ceramic shell is about 30 nm. In one embodiment, the thickness of the ceramic shell is about 40 nm. In one embodiment, the thickness of the ceramic shell is about 50 nm. In one embodiment, the thickness of the ceramic shell is about 60 nm. In one embodiment, the thickness of the ceramic shell is about 70 nm. In one embodiment, the thickness of the ceramic shell is about 80 nm. In one embodiment, the thickness of the ceramic shell is about 90 nm. In one embodiment, the thickness of the ceramic shell is about 100 nm.

In one embodiment, the thickness of the ceramic shell is uniform over the polymer core. In one embodiment, the thickness of the ceramic shell is partially uniform over the polymer core. In one embodiment, the composite material exhibits a homogenous surface. In one embodiment, the composite material exhibits a homogenous internal structure.

In one embodiment, the ceramic-polymer composite exhibits an improved compressive Young's modulus relative to a pristine polymer material that has not been subjected to ceramic deposition. Young's modulus, also known as the elastic modulus, is a measure of the ability of a material to withstand changes in length when under lengthwise tension or compression. In one embodiment, nanoindentation is performed in the radial direction, normal to the fiber surface. In one embodiment, nanoindentation is performed at room temperature (about 20-25° C.). In one embodiment, nanoindentation applies an ultra-low load (such as in the μN range), in which the intermolecular interactions are disrupted, rather than covalent interactions. In one embodiment, the Young's modulus of a material can be measured using nanoindentation, using any apparatus known to one of skill in the art.

In one embodiment, the Young's modulus of the pristine polymer is less than 6 GPa. In one embodiment, the Young's modulus of the pristine polymer is about 5.3 GPa. In one embodiment, the Young's modulus of a polymer material that has been treated with acid is about 7.9 GPa. In one embodiment, the Young's modulus of the ceramic-polymer composite is greater than about 6 GPa. In one embodiment, the Young's modulus of the ceramic-polymer composite is greater than about 7 GPa. In one embodiment, the Young's modulus of the ceramic-polymer composite is greater than about 8 GPa. In one embodiment, the Young's modulus of the ceramic-polymer composite is greater than about 9 GPa. In one embodiment, the Young's modulus of the ceramic-polymer composite is greater than about 10 GPa. In one embodiment, the Young's modulus of the ceramic-polymer composite is greater than about 11 GPa. In one embodiment, the Young's modulus of the ceramic-polymer composite is greater than about 12 GPa. In one embodiment, the Young's modulus of the ceramic-polymer composite is greater than about 13 GPa. In one embodiment, the Young's modulus of the ceramic-polymer composite of the invention is about 11.5 GPa. In one embodiment, the Young's modulus of the ceramic-polymer composite of the invention is about 13.9 GPa.

In one embodiment, the hardness of the ceramic-polymer composite can be measured using nanoindentation, using any apparatus known to one of skill in the art. In one embodiment, the hardness of the ceramic-polymer composite is a measure of the resistance to plastic deformation. In one embodiment, the hardness of the ceramic-polymer composite is greater than about 800 MPa. In one embodiment, the hardness of the ceramic-polymer composite is greater than about 900 MPa. In one embodiment, the hardness of the ceramic-polymer composite is greater than about 1000 MPa. In one embodiment, the hardness of the ceramic-polymer composite is greater than about 1100 MPa. In one embodiment, the hardness of the ceramic-polymer composite is greater than about 1200 MPa. In one embodiment, the hardness of the ceramic-polymer composite is greater than about 1300 MPa. In one embodiment, the hardness of the ceramic-polymer composite is greater than about 1400 MPa. In one embodiment, the hardness of the ceramic-polymer composite is greater than about 1500 MPa. In one embodiment, the hardness of the ceramic-polymer composite is greater than about 1600 MPa. In one embodiment, the hardness of the ceramic-polymer composite is greater than about 1700 MPa. In one embodiment, the hardness of the ceramic-polymer composite is greater than about 1800 MPa. In one embodiment, the hardness of the ceramic-polymer composite is greater than about 1900 MPa. In one embodiment, the hardness of the ceramic-polymer composite is greater than about 2000 MPa. In one embodiment, the hardness of the ceramic-polymer composite is greater than about 2100 MPa. In one embodiment, the hardness of the ceramic-polymer composite is greater than about 2200 MPa. In one embodiment, the hardness of the ceramic-polymer composite is greater than about 2300 MPa. In one embodiment, the hardness of the ceramic-polymer composite is greater than about 2400 MPa. In one embodiment, the hardness of the ceramic-polymer composite is greater than about 2500 MPa.

In one embodiment, the ceramic-polymer composite is more resistant to degradation than the pristine polymer material. In one embodiment, the degradation of the polymer material can result in the deterioration of its mechanical properties. In one embodiment, the ceramic-polymer composite is more resistant to degradation by UV light such as 365 nm light of intensity 16 mW/cm$^2$. In one embodiment, exposure to UV light effects the formation of reactive free radicals in the polymer material, for example by excitation of aromatic rings. In one embodiment, the degree of degradation can be ascertained by measurement of the Young's modulus and the hardness of the material before, during, and after treatment with UV light. In one embodiment the compressive Young's modulus of the ceramic-polymer composite decreases by less than about 25%, less than about 20%, less than about 15%, less than about 10%, or less than about 5%, over 300 hours of exposure to UV light. In one embodiment the compressive Young's modulus of the ceramic-polymer composite decreases by less than about 5% over 300 hours of exposure to UV light. In one embodiment the hardness of the ceramic-polymer composite decreases by less than about 25%, less than about 20%, less than about 15%, less than about 10%, or less than about 5% over 300 hours of exposure to UV light. In one embodiment the hardness of the ceramic-polymer composite decreases by less than about 5% over 300 hours of exposure to UV light. Contrastingly, the compressive Young's modulus and hardness of the pristine polymer material decrease by more than about 20% over 300 hours of exposure to UV light. In one embodiment, the compressive Young's modulus and hardness of the pristine polymer material decrease by about 25% over 300 hours of exposure to UV light.

In one embodiment, the degree of degradation can be ascertained by observation of the color of the material before and after treatment with UV light. In one embodiment, the color of pristine polymer material changes from light yellow to dark brown over 300 hours of exposure to UV light. In one embodiment, the color of the ceramic-polymer composite does not significantly change over 300 hours of exposure to UV light.

In one embodiment, the ceramic-polymer composite is more resistant to degradation by strong oxidants such as $H_2O_2$ compared to the pristine polymer material. In one embodiment, the degree of degradation can be ascertained by measurement of the Young's modulus and the hardness of the material before, during, and after treatment with the strong oxidant such as a commercially available aqueous 30 wt % $H_2O_2$ solution. In one embodiment, strong oxidants can break down aromatic rings and/or hydrogen bonding groups, in addition to other functional groups, in the polymer material. In one embodiment, the compressive Young's modulus of the ceramic-polymer composite decreases by less than about 70%, less than about 60%, less than about 50%, less than about 40%, less than about 30%, less than about 20%, less than about 10%, or less than about 5% upon 7 days of treatment with a strong oxidant. In one embodiment, the compressive Young's modulus of the ceramic-polymer decreases by less than about 5% upon 7 days of treatment with a strong oxidant. Contrastingly, the compressive Young's modulus of the pristine polymer material decreases by greater than or equal to about 70% upon 7 days of treatment with a strong oxidant.

In one embodiment, the hardness of the ceramic-polymer composite decreases by less than about 80%, less than about 70%, less than about 60%, less than about 50%, less than about 40%, less than about 30%, less than about 20%, less than about 10%, less than about 9%, less than about 8%, or less than about 7%, upon 7 days of treatment with a strong oxidant. In one embodiment, the hardness of the ceramic-polymer composite decreases by less than about 7% upon 7 days of treatment with a strong oxidant. Contrastingly, the hardness of the pristine polymer material decreases by greater than or equal to 80% upon 7 days of treatment with a strong oxidant.

In one embodiment, the thermal diffusion rate of the ceramic-polymer composite is greater than that of the pristine polymer material. In one embodiment, the thermal diffusion rate can be determined by cooling samples of the ceramic-polymer composite and the pristine polymer material under the same conditions. In one embodiment, the ceramic-polymer composite is at least 1° C. cooler than the polymer material after 100 s under the same cooling conditions. In one embodiment, the ceramic-polymer composite is at least about 1.2° C. cooler, 1.4° C. cooler, 1.6° C. cooler, 1.8° C. cooler, 2.0° C. cooler, or 2.2° C. cooler, than the polymer material after 100 s under constant cooling conditions. In one embodiment, the ceramic-polymer composite is at least about 2.2° C. cooler than the polymer material after 100 s under constant cooling conditions. In one embodiment, the enhanced thermal conductivity of the ceramic-polymer composite of the present invention retards the physical degradation of the composite material.

Ballistic Resistant Materials

In one aspect, the present invention relates in part to a ballistic resistant material comprising a ceramic-polymer composite made using the methods described elsewhere herein. For example, the ballistic resistant material may comprise flexible, soft armor articles; rigid, hard armor articles; or fabrics comprising the ceramic-polymer composite described herein.

Exemplary flexible, soft articles include, but are not limited to, garments such as vests, pants, hats, or other articles of clothing, or covers or blankets used by military personnel to defeat a number of ballistic threats, such as 9 mm full metal jacket (FMJ) bullets, and a variety of fragments generated due to explosion of hand-grenades, artillery shells, Improvised Explosive Devices (IED) and other such devises encountered in military and peace keeping missions. As used herein, "soft" or "flexible" armor is armor that does not retain its shape when subjected to a significant amount of stress and/or is incapable of being free-standing without collapsing. In one embodiment, garments comprising the ceramic-polymer composite of the invention may be formed through methods conventionally known in the art. In one embodiment, the garment is formed by adjoining the ballistic resistant articles of the invention with an article of clothing. For example, a vest may comprise a generic fabric vest that is adjoined with the ballistic resistant structures of the invention, whereby the inventive articles are inserted into strategically placed pockets. As used herein, the terms "adjoining" or "adjoined" are intended to include attaching, such as by sewing or adhering and the like, as well as un-attached coupling or juxtaposition with another fabric, such that the ballistic resistant articles comprising the ceramic-polymer composite of the invention may optionally be easily removable from the vest or other article of clothing.

Exemplary hard armor articles include, but are not limited to, helmets, panels for military vehicles, or protective shields, which have sufficient mechanical strength so that the hard armor article maintains structural rigidity when subjected to a significant amount of stress and is capable of being freestanding without collapsing. In one embodiment, the ceramic-polymer composite can be cut into a plurality of discrete sheets and stacked for formation into an article or they can be formed into a precursor which is subsequently used to form an article. Such techniques are well known in the art.

EXPERIMENTAL EXAMPLES

The invention is now described with reference to the following Examples. These Examples are provided for the purpose of illustration only, and the invention is not limited to these Examples, but rather encompasses all variations that are evident as a result of the teachings provided herein.

Example 1: Poly(P-Phenylene Terephthalamide) Fibers Reinforced with Ultrathin Ceramic Coatings Here, a hybrid material approach is described, which entails integrating ultra-thin ceramic coatings onto the PPTA fibers to enhance their compressive mechanical properties and energy absorption, as well as their thermal conductivity and chemical stability. By applying nanometer-thick coatings on single fiber, the lightweight flexible PPTA fibers are maintained. This provides a new route for obtaining high performance PPTA fibers with a compressive Young's modulus which is about 2.5 times higher than that of the untreated fibers. The mechanical properties of ultrathin-ceramic coated fibers are studied with a nanoindentation technique, by applying loadings at a micro-Newton scale for nano/micrometer deformations.

Materials and Methods

PPTA fibers with the trade name of Kevlar® 29 were obtained from Goodfellow USA, (125 Hookstown Grade Road, Coraopolis, PA 15108-9302, USA). Tetraethyl orthosilicate (TEOS) was purchased from Acros-Organics (Janssen-Pharmaceuticalaan 3, 2440 Geel, Belgium). Trimethyl aluminum (TMA), Ammonium hydroxide ($NH_4OH$) solution (28.0%-30% $NH_3$ basis) was obtained from Sigma-Aldrich (6950 Ambassador Dr, Allentown, PA 18106). Sulfuric acid ($H_2SO_4$) and sodium hydroxide (NaOH) was purchased from Fisher Chemical Deionized (DI) water are purified in our own lab.

The PPTA fibers were aligned on a glass frame to prevent shrinkage and distortion. The frame was then immersed into the concentrated sulfuric acid (98% $H_2SO_4$) for 10 s to dissolve rapidly a certain amount of the surface of the fiber. After that, the frame was immersed in DI water for 30 s to coagulate partially the fibers. Then, for complete neutralization, the frame was immersed sequentially in distilled water, 20 wt % NaOH solution, and distilled water for 15 min, 20 min and 10 h, respectively. Finally, the resulting PPTA fibers were dried in a vacuum oven at 80° C. at low pressure (~1 kPa) for 24 hrs to prevent warping.

The PPTA fibers were placed onto the sample stage in the atomic layer deposition (ALD) chamber and secured to prevent moving during the vacuum process. The chamber was then subjected to a vacuum of about 0.005 torr. After that, 100 SCCM of argon gas was allowed to fill the chamber so that the working pressure in the chamber increases up to 0.13 torr. The Ar gas flow was maintained at this pressure for the entire coating process. The temperature of the chamber was then elevated up to 200° C. for the alumina deposition. The deposition of alumina through ALD is a chemical vapor deposition process. Trimethyl aluminum (TMA) and deionized (DI) water were used as precursors. Firstly, TMA was purged into the chamber followed by the purging of DI water. This completes one cycle of the process that coats about one Angstrom-thick alumina layer on the PPTA sample. The desired thickness for samples was 50 nm and therefore, the PPTA was subjected to a process of 500 cycles. After 500 cycles, the system was allowed to cool down to room temperature before exposing the sample to air.

For the silica coating, 0.1 mg PPTA fibers were aligned on a glass frame to prevent shrinkage and distortion. TEOS (0.5 mL) and EtOH (20 mL) were mixed together and stirred to a homogeneous solution. The frame was then immersed in the solution. After that, 2 mL NH$_4$OH (20%) was dropped slowly into the EtOH/TEOS solution. After 5 hrs of stirring the mixture, the PPTA fibers were taken out and washed several times with water to remove the byproducts. Finally, the resulting PPTA fibers were dried in a vacuum oven at 140° C. for 12 hrs to remove the moisture and increase the crystallinity.

The nanoindentation tests were performed using a TI980 TriboIndenter with a diamond Berkovich tip. The tip was used to make indentation in the radial direction, normal to the as-received fiber surface. For the nanoindentation tests, the single untreated or treated PPTA fiber was mounted on a glass tube (1 cm diameter). Approximately 2 g washers were anchored to the ends of single fiber chosen at random from bundles. The fibers were suspended perpendicularly over the tube axis. The weights were allowed to hang freely to ensure good contact between the sample and substrate near the apex of the tube. Two small drops of adhesive (using a tapered cotton swab) were then placed approximately 0.5 cm apart, centered on the tube apex. The adhesive was allowed to dry and the excess fiber outside the mounting area was removed. Measurements were performed in displacement control mode, with a maximum indent depth of approximately 100 nm. A drift correction was performed prior to indentation. The loading rate was 20 nm s$^{-1}$. Holding time was 5 seconds. The optical images were recorded by an Olympus BX51 microscope and processed by a computer. The SEM images were taken from FEI Quanta450FEG. The X-ray diffraction analysis was carried out using a Rigaku CCD diffractometer with Cu-Kα radiation ($\lambda$=1.54184 Å). Transmission electron microscopy (TEM) images were taken on a JEOL Model 100CX transmission electron microscope at an acceleration voltage of 100 kV.

H$_2$O$_2$ treatment was performed by aligning the PPTA fibers on a glass frame to prevent shrinkage and distortion. The frame was then immersed in a hydrogen peroxide solution (30 wt. % in H$_2$O, ACS reagent) for a specific time. The frame was then immersed into DI water for 15 mins and then vacuum-treated for 30 mins prior to testing.

The results of the experiments will now be discussed.

Figure 2:
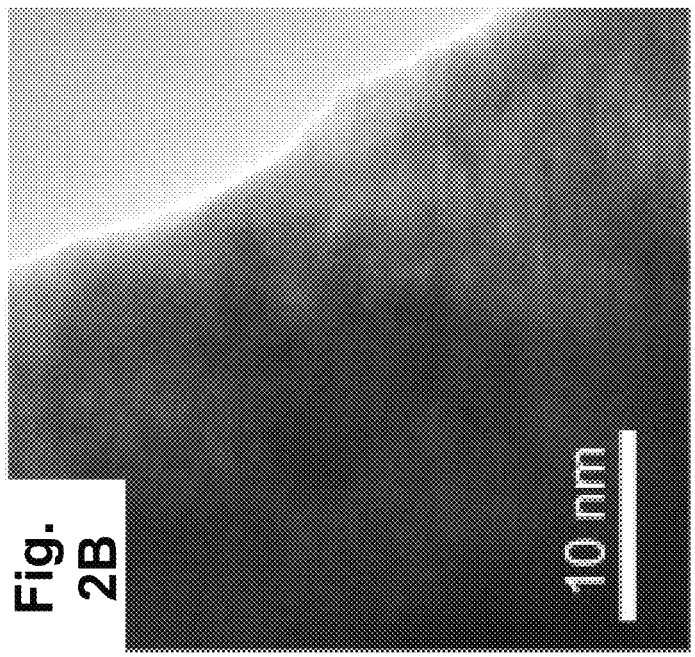
FIG. 2, comprising
Figure 2:
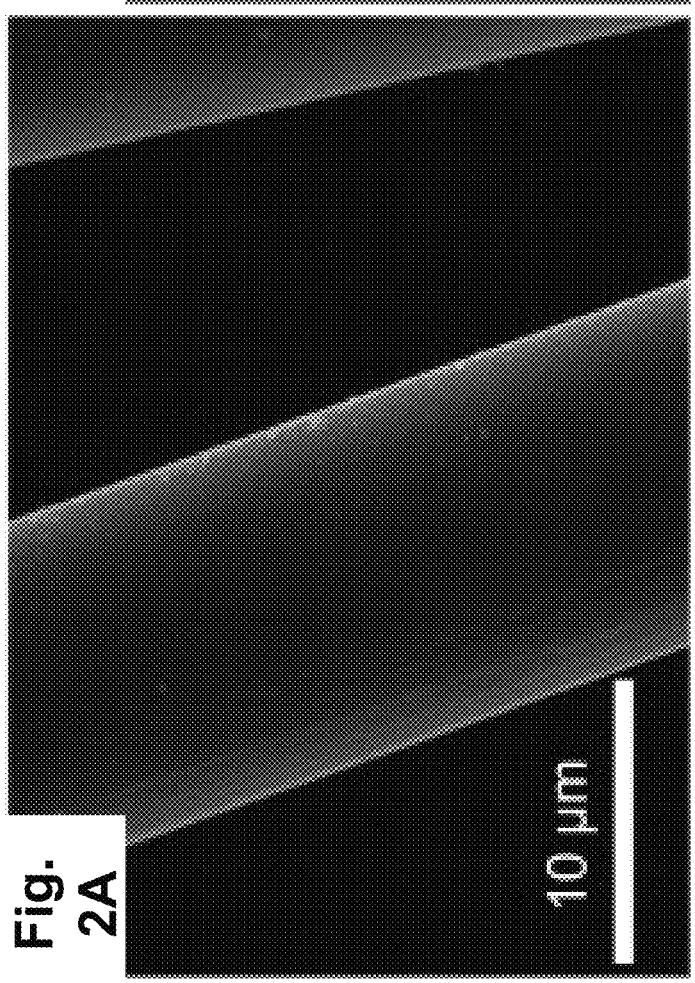
Figure 3:
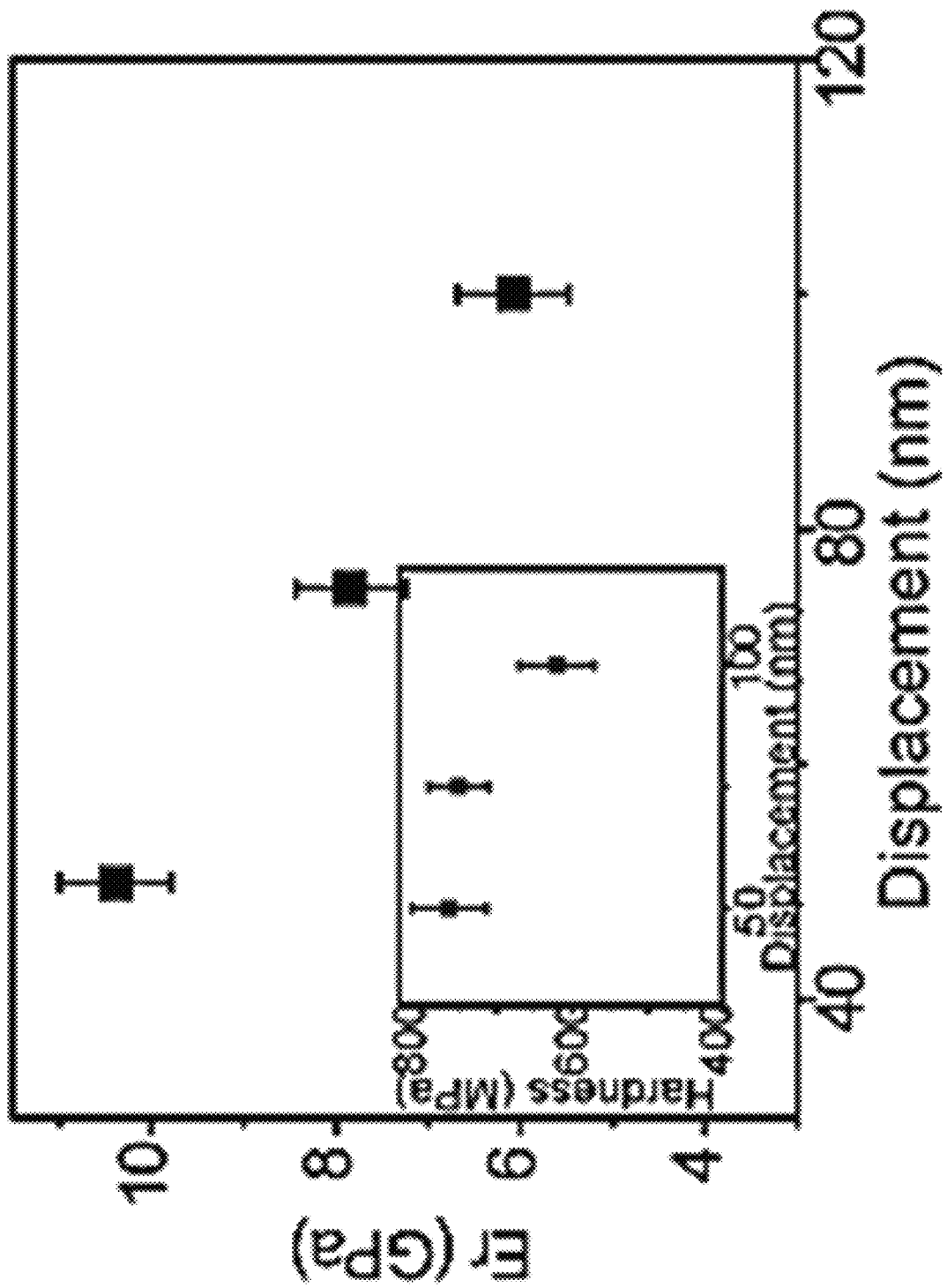
FIG. 3 is a plot of mechanical properties of pristine PPTA fiber.

The scanning electron microscopy (SEM) image of an individual PPTA fiber (~14 μm diameter) is shown in FIG. 2A. The examination of the fiber via transmission electron microscopy (TEM) reveals the existence of micro-voids and other crystalline defects around the periphery of the fiber (FIG. 2B). In order to investigate its compressive mechanical properties, the fiber is subjected to nanoindentation analysis at different indentation (vertical displacement) depths. The results displayed in FIG. 3, which shows the modulus and hardness of PPTA fibers at indentation depths of 50 nm, 75 nm, and 100 nm. The increase in the indentation depth (from 50 nm to 100 nm) results in a decrease in the average modulus (from 11 GPa to 7 GPa), accompanied by a reduction in hardness from 750 MPa to 620 MPa. This decreasing trend could be assigned to the increase of defects in the surface region which in turn increases the displacement. It should be noted that nanoindentation applies an ultra-low load (micro-Newton), such that hydrogen bonds, rather than covalent bonds, are disrupted.

Figure 4:
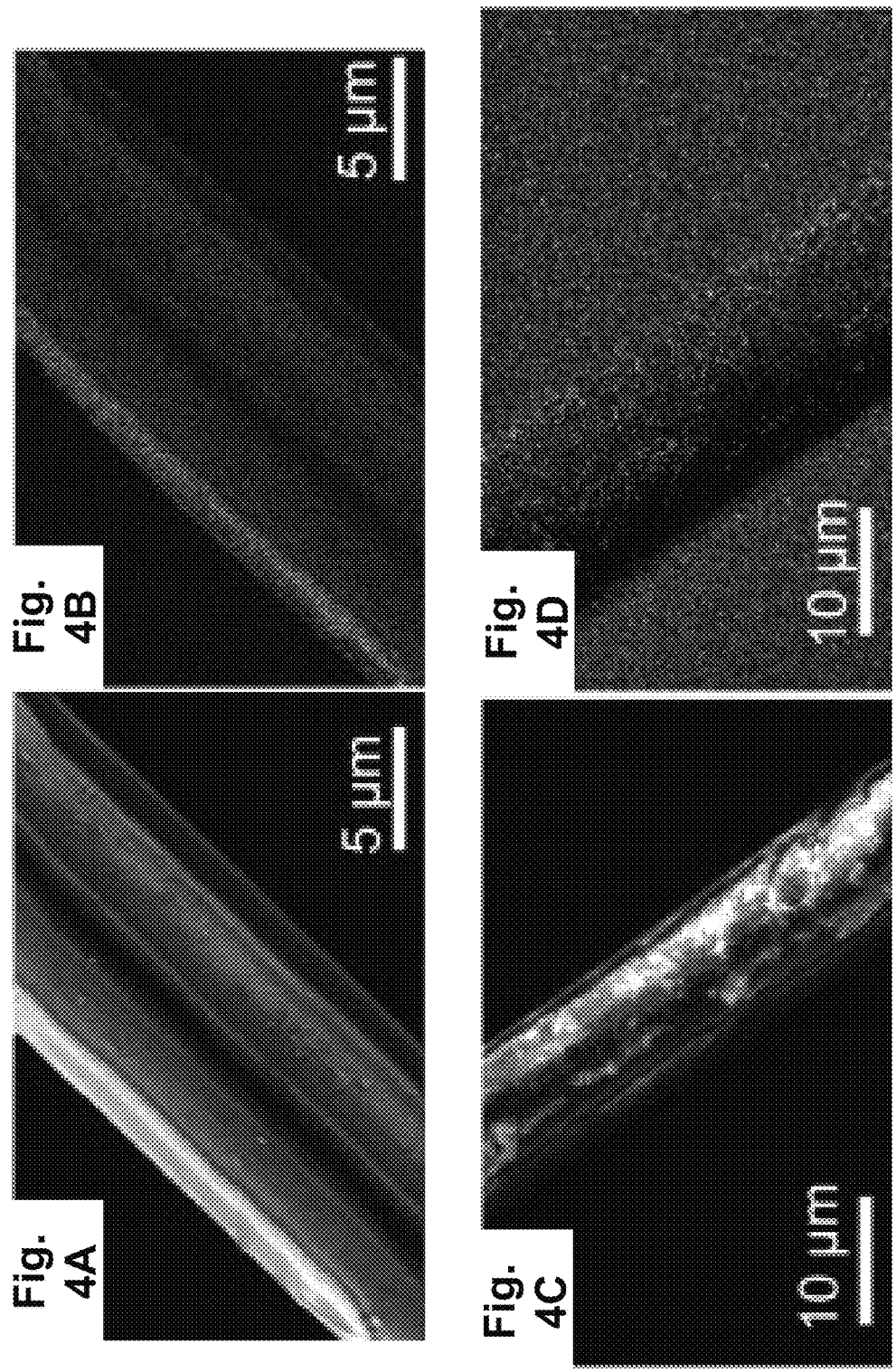
FIG. 4, comprising
Figure 5:
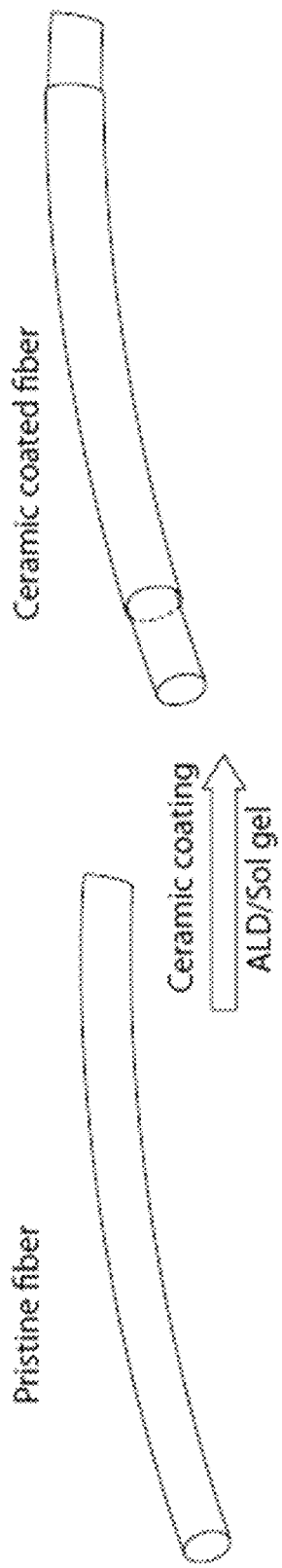
FIG. 5 is a schematic representation of an exemplary process of coating a pristine PPTA fiber with a ceramic material.
Figure 6:
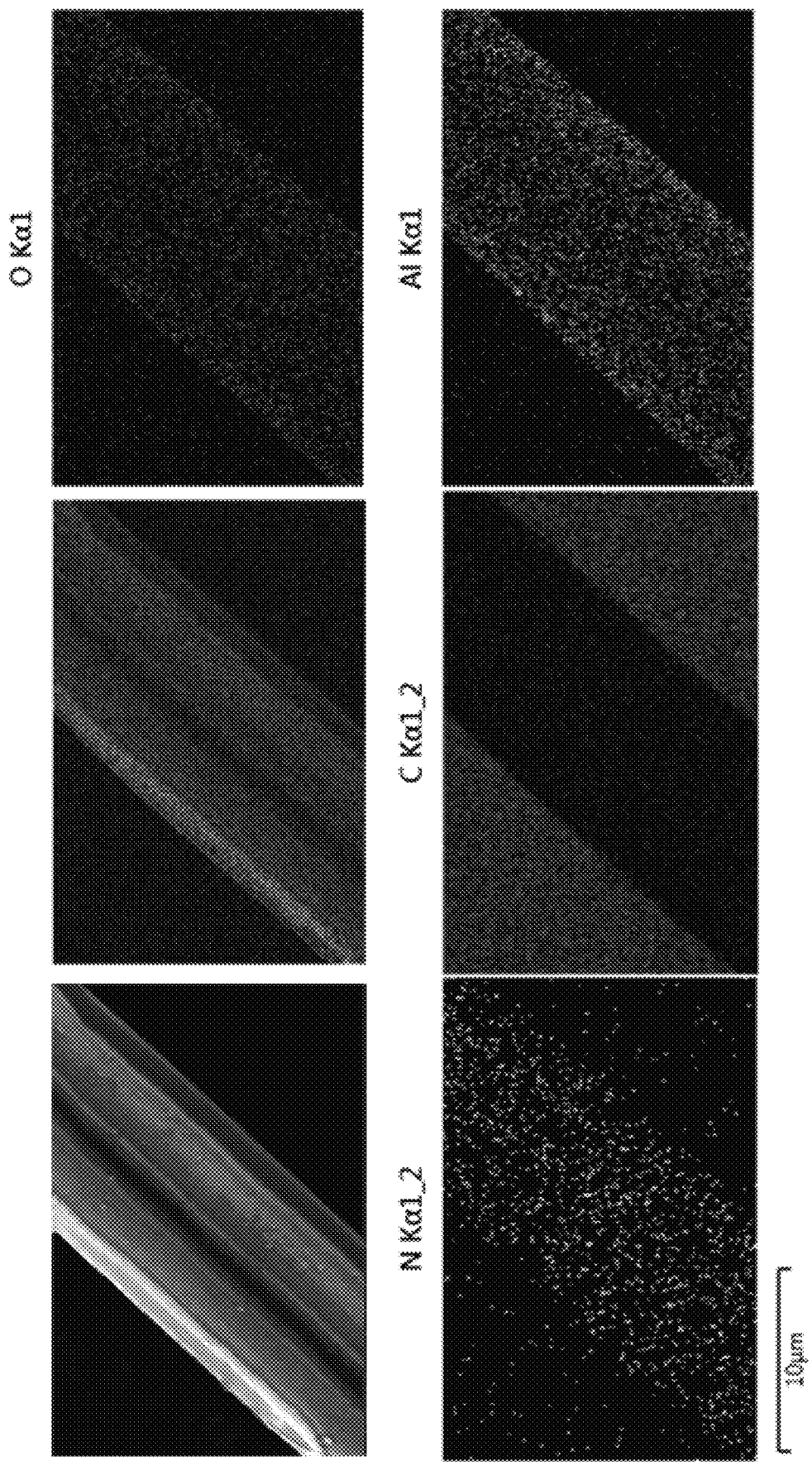
FIG. 6 depicts SEM and corresponding chemical mapping images (layered, O, N, C, and Al) of alumina-coated PPTA fiber.
Figure 7:
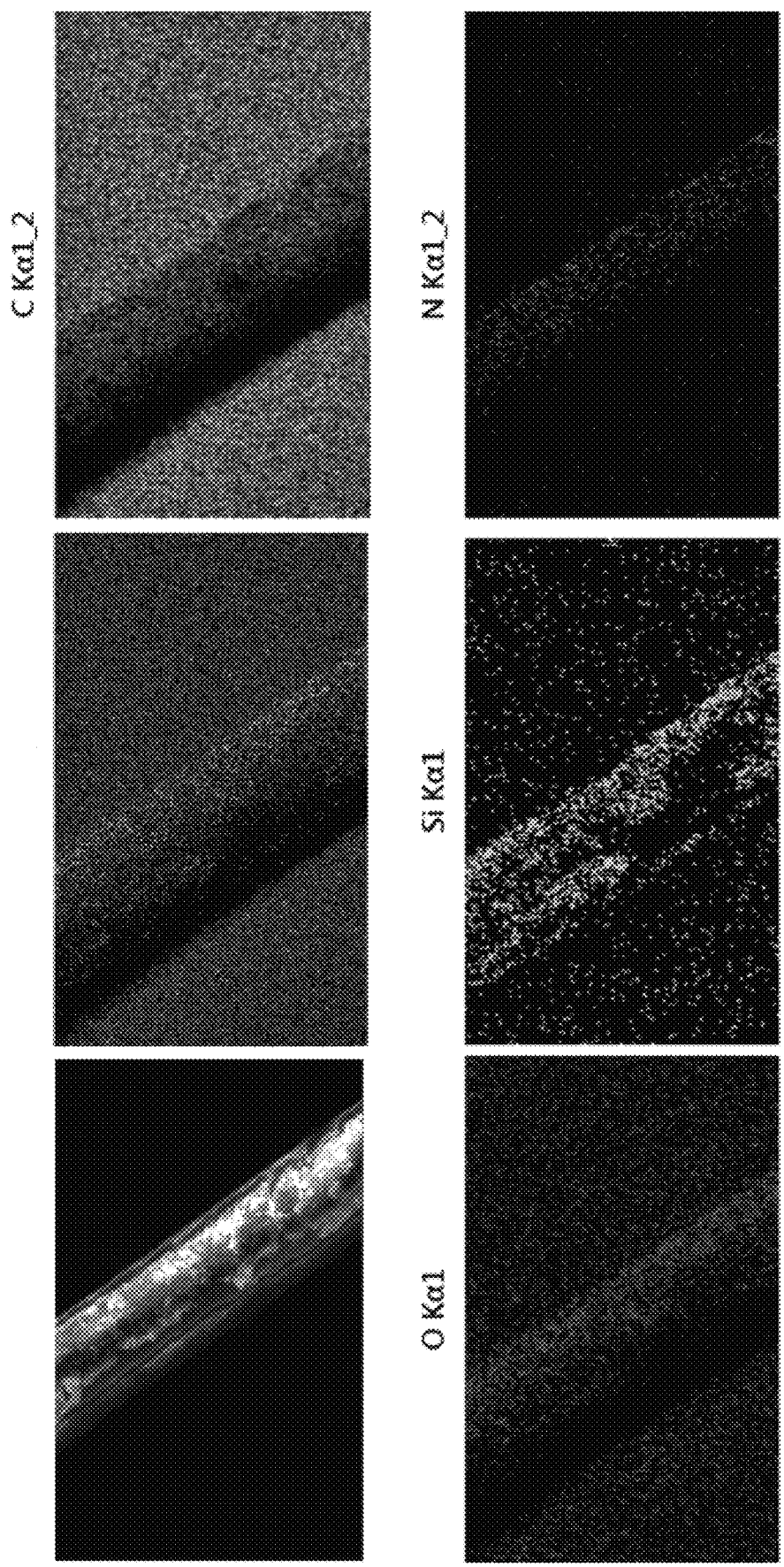
FIG. 7 depicts SEM and corresponding chemical mapping images (layered, C, O, Si, and N) of silica-coated PPTA fiber.
Figure 8:
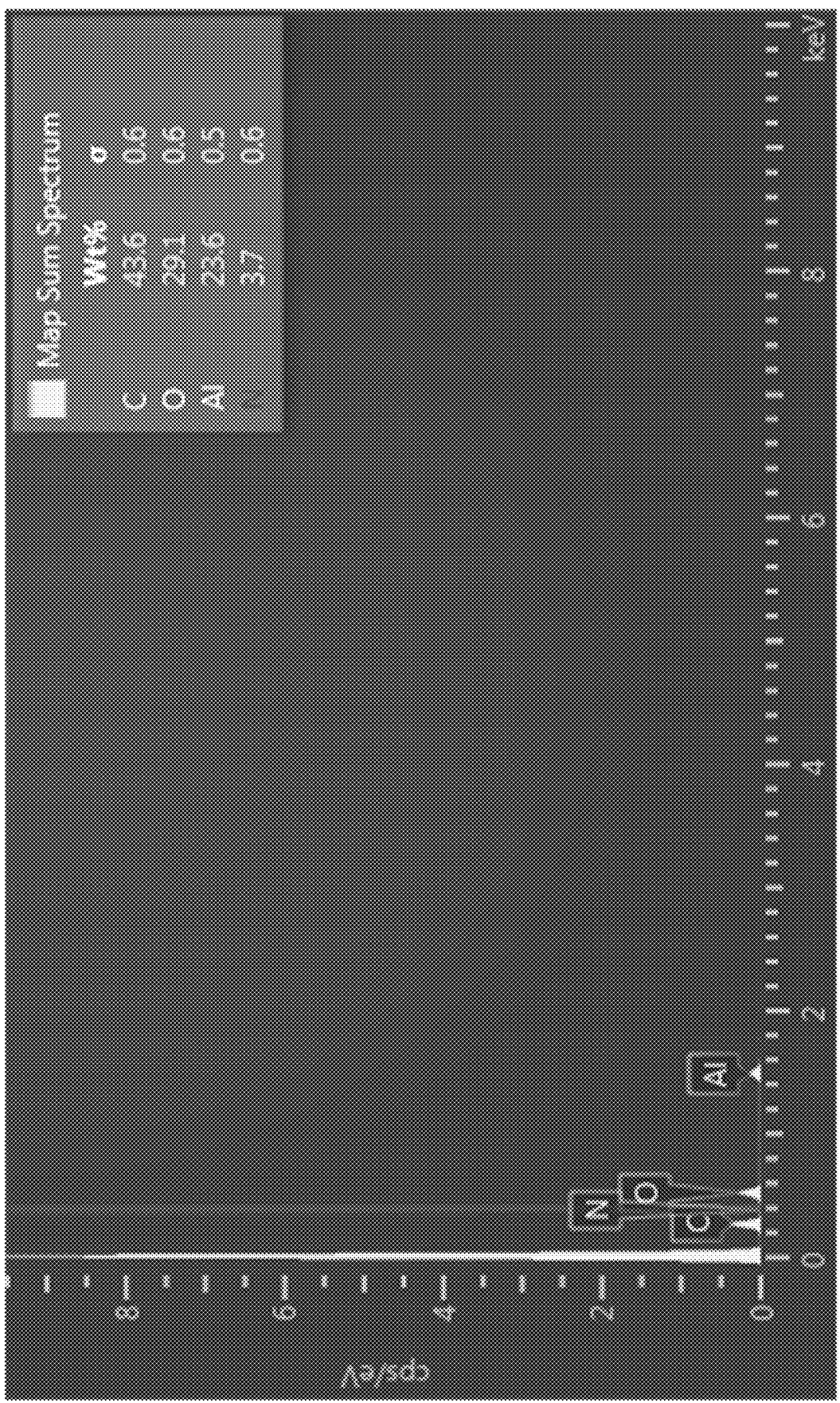
FIG. 8 is an energy dispersive spectroscopy (EDS) plot of an alumina-coated PPTA fiber.
Figure 9:
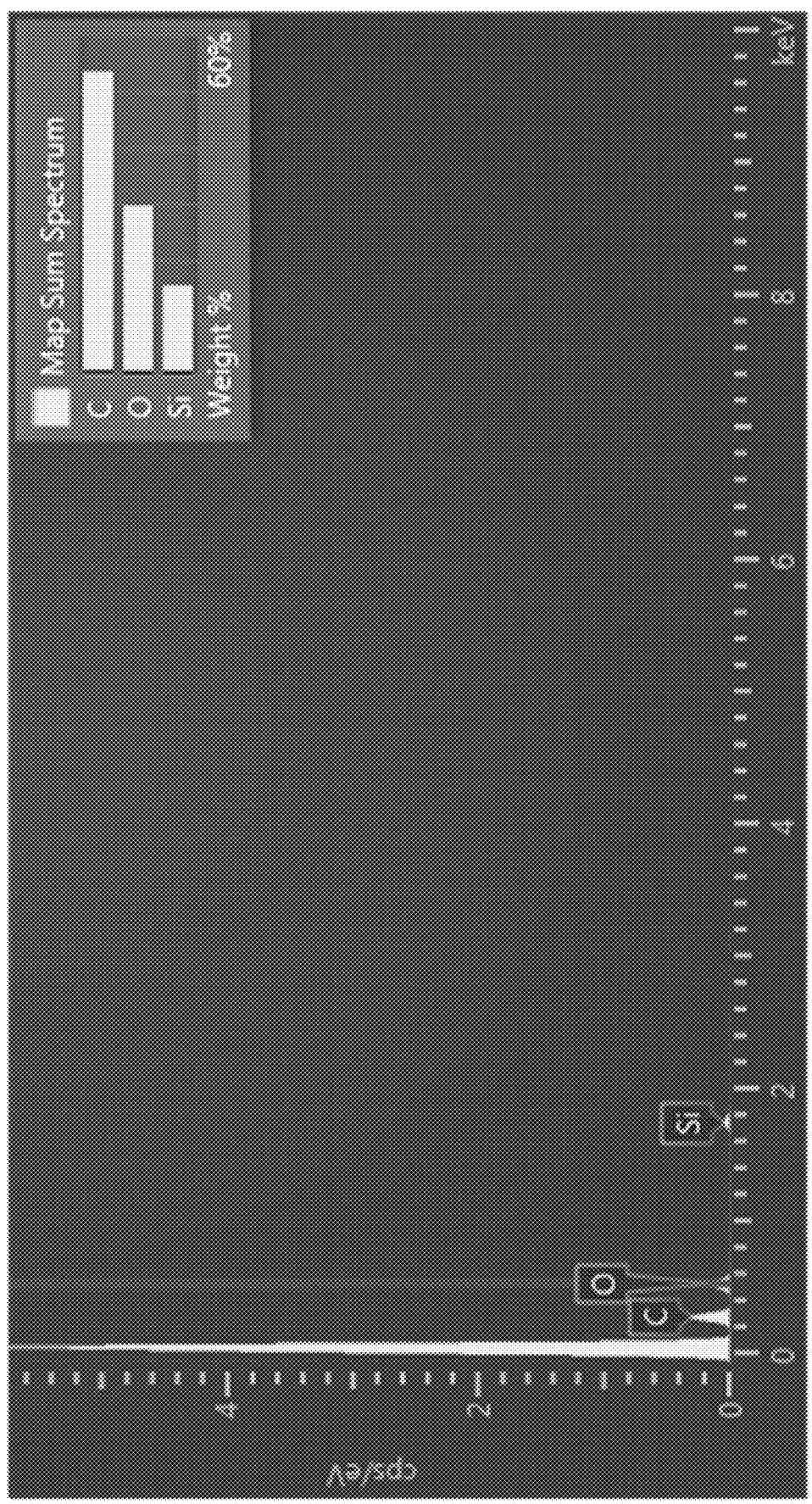
FIG. 9 is an EDS plot of a silica-coated PPTA fiber.

In order to increase the compressive modulus along the cross-section direction of the PPTA fibers, ultrathin coatings of alumina (FIG. 4A and FIG. 4B) and silica (FIG. 4C and FIG. 4D) were applied to their surface; an illustrative depiction of the coating process is shown in FIG. 5. The ceramic oxides exhibit Young's moduli larger than 330 GPa (Wachtman and Lam, Journal of the American Ceramic Society, 1959, 42, 254-260), which leads to a significant improvement in the mechanical properties of hybrid composites. From the SEM images (FIGS. 6 and 7) and energy dispersive X-ray spectroscopy (EDS) mapping images (FIGS. 8 and 9), the formation of a uniform ceramic oxide shell onto the surface of an individual PPTA fiber can be observed.

Figure 10:
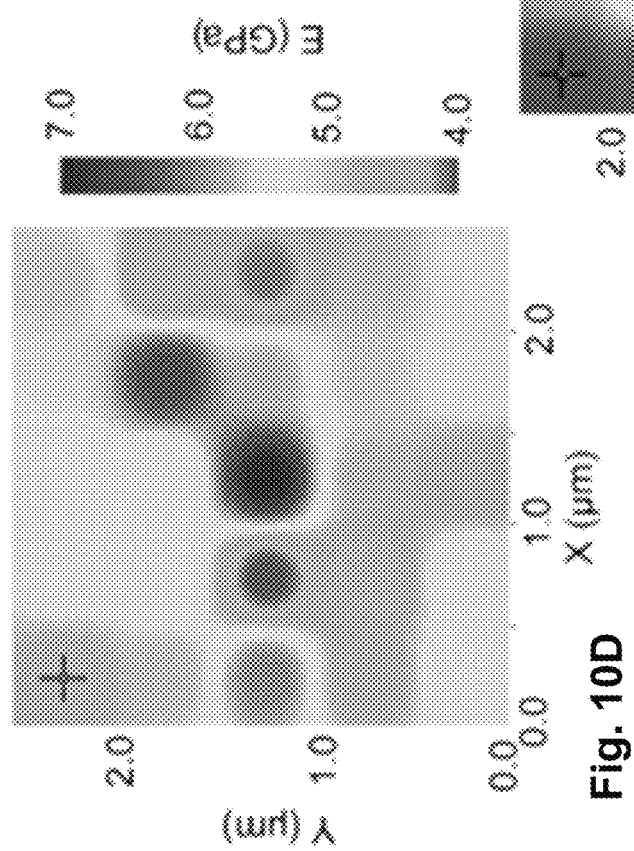
FIG. 10, comprising
Figure 10:
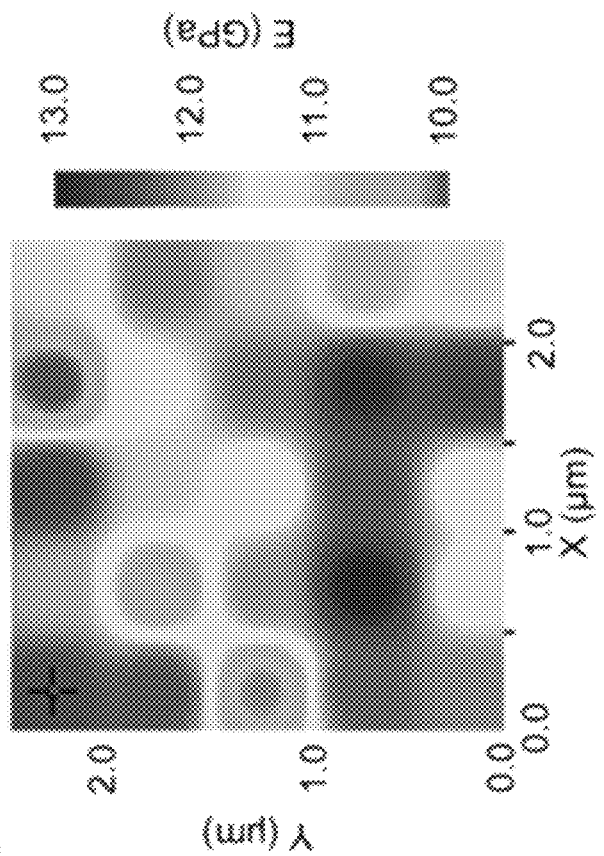

A PPTA fiber coated with a layer of alumina measuring 50 nm in thickness was further examined in order to determine the effect of the coating on the mechanical properties and on the flexibility of single fiber. The TEM image of this fiber displayed in FIG. 10A reveals two regions, the core and the alumina shell. The PPTA fiber shows no change in morphology or structural damage after its coating with alumina, which appears as a uniform layer of an average thickness of 50 nm. It is possible that the cohesive interface between the PPTA fiber core and alumina layer shell facilitates the synergistic response capacity to external forces. The X-ray diffraction pattern (FIG. 10B) confirms no degradation of the structure of PPTA fiber after the coating with the crystalline oxide. The pristine PPTA fiber shows two distinct peaks appearing at 2θ=20.7° and 23.1°, which correspond to the {110} and {200} planes, respectively (Kong, et al., RSC Advances, 2014, 4, 20599-20604). After the alumina coating, the position of the peaks remains unchanged, indicating that the PPTA structure is preserved. In addition, two new diffraction peaks occur at 2θ=37.1° and 38.9°, representing the {311} and {222} planes of crystalline alumina (Adans, et al., Materials Research, 2016, 19, 977-982). Due to the high Young's modulus of the crystalline alumina shell, the strength of the PPTA composite fibers increased significantly. This result can be observed in FIGS. 10C, 10D, and 10E, which show the loading-unloading curves and the ultra-fast extreme property mapping (XPM). FIG. 10C displays the compressive force-displacement curves recorded on the pristine PPTA fiber and an alumina coated fiber over a displacement of 100 nm. In FIG. 10C, N$_{max}$ is the peak indentation load and h$_{max}$ is the indenter displacement at peak load. The hardness is given by $$H = \frac{P_{max}}{A} \qquad (1)$$

and the Young's modulus, E, of the indented specimen is found from:

$$\frac{1}{E_r} = \frac{(1-v^2)}{E} + \frac{(1-v_i^2)}{E_i}, E_r = \frac{\sqrt{\pi}}{2\beta}\frac{S}{\sqrt{A}}, \qquad (2)$$

where A is the contact area at the peak load and $$S = \frac{dP}{dh} \quad (3)$$

is the initial unloading contact stiffness, $\beta$ is a dimensionless parameter depending on the indenter geometry, $E_r$ is the reduced modulus, E is the elastic modulus of the indenter, v and $v_i$ are the Poisson's ratios of the sample and the indenter probe, respectively. As A, $\beta$, $E_i$, v, and $v_i$ are known constants, the hardness and Young's modulus can be resolved by solving formulas (1) and (2) (Hay, et al., Journal of Materials Research, 1999, 14, 2296-2305). Performing a similar experiment for the PPTA pristine fiber and using the same displacement (100 nm) and contact area, the calculations show that the hardness of the 50 nm alumina-coated PPTA fiber is 3.25 times higher than that of the pristine PPTA fiber and the Young's modulus of the alumina-coated PPTA fibers is ~2.5 times higher than that of the pristine PPTA fiber. Furthermore, from the ultra-fast extreme property mapping (XPM), the spatial distribution statistics of localized mechanical properties of PPTA fibers are obtained. The measurement is carried out on the surface of PPTA fibers over a 2×2 µm² area with 5×5 grid pattern. The corresponding XPM images of pristine and alumina-coated PPTA fibers are shown in FIGS. 10D and 10E, respectively, revealing their homogeneous surface and internal structure. The alumina-coated PPTA fibers exhibit a larger average modulus of 11.5 GPa as compared to that of pristine fibers with the average modulus of 5.3 GPa. The consistent loading-unloading and XPM measurements confirm the enhancement of compressive mechanical properties after coating with ultrathin ceramic shells.

Figure 11:
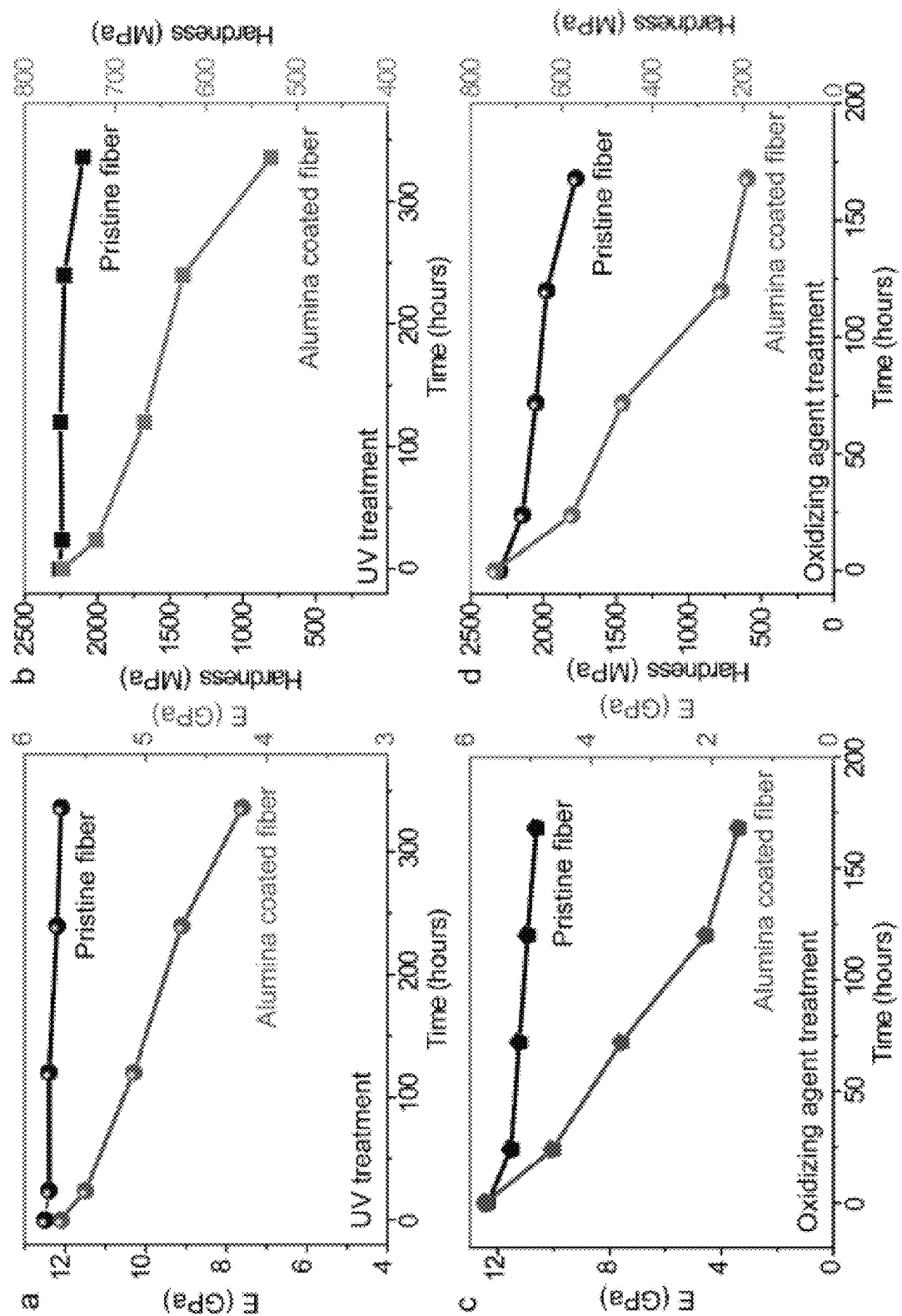
FIG. 11, comprising

PPTA possesses aromatic rings, which, upon UV radiation, can generate highly active free radicals, leading to the severe degradation over long exposure times (Cunniff, in Proceedings of the 18th international symposium of ballistics, Vol. 1, CRC, Boca Raton, FL, 1999, pp. 814-821; Cunniff, Textile Research Journal, 1996, 66, 45-58). Therefore, the compressive mechanical properties of the alumina-coated PPTA fibers upon exposure to UV light for more than 300 hrs was investigated under accelerated testing conditions. A significant change in the color of pristine PPTA fiber is observed over the course of treatment with 365 nm UV light; the color of the fiber gradually changed from light yellow to dark brown. This color change indicates a possible structural deformation in the PPTA. Contrastingly, the color of the alumina-coated PPTA fibers remains the same after 300 hrs of UV radiation. A corresponding nanoindentation analysis reveals that the compressive Young's modulus and hardness of PPTA fibers decrease by approximately 25% after 300 hrs of UV exposure (FIGS. 11A and 11B). Alumina exhibits a wide bandgap, a strong extinction coefficient, and a large refractive index, which makes it a suitable candidate as a UV protection material. On the other hand, the color of alumina-coated PPTA fibers remains the same after 300 hrs of UV radiation. Significantly, the corresponding compressive Young's modulus and hardness of alumina-coated PPTA fibers decrease less than 5%, indicating the stability and robustness of the PPTA fibers coated with alumina.

In addition, owing to its chemical stability, alumina can be further used to protect the underlying PPTA fibers from strong oxidant etching (FIGS. 11C and 11D). The excellent mechanical properties of PPTA fibers result from the covalent bonding along the polymer backbone together with the hydrogen bonding and aromatic stacking interactions. However, when the aromatic rings and hydrogen bonding groups are oxidized by strong oxidants, like $H_2O_2$, the bonds break, leading to a deterioration in the mechanical properties. The modulus and hardness of pristine PPTA fibers decrease approximately 70% and 80%, respectively, after 7 days of accelerated strong oxidant treatment. In contrast, the modulus and hardness of alumina-coated PPTA fibers decrease only 5% and 7%, respectively, after 7-day accelerated treatment. The preservation of mechanical properties after UV exposure and chemical treatment validates the stability of alumina coating for PPTA fibers.

Figure 12:
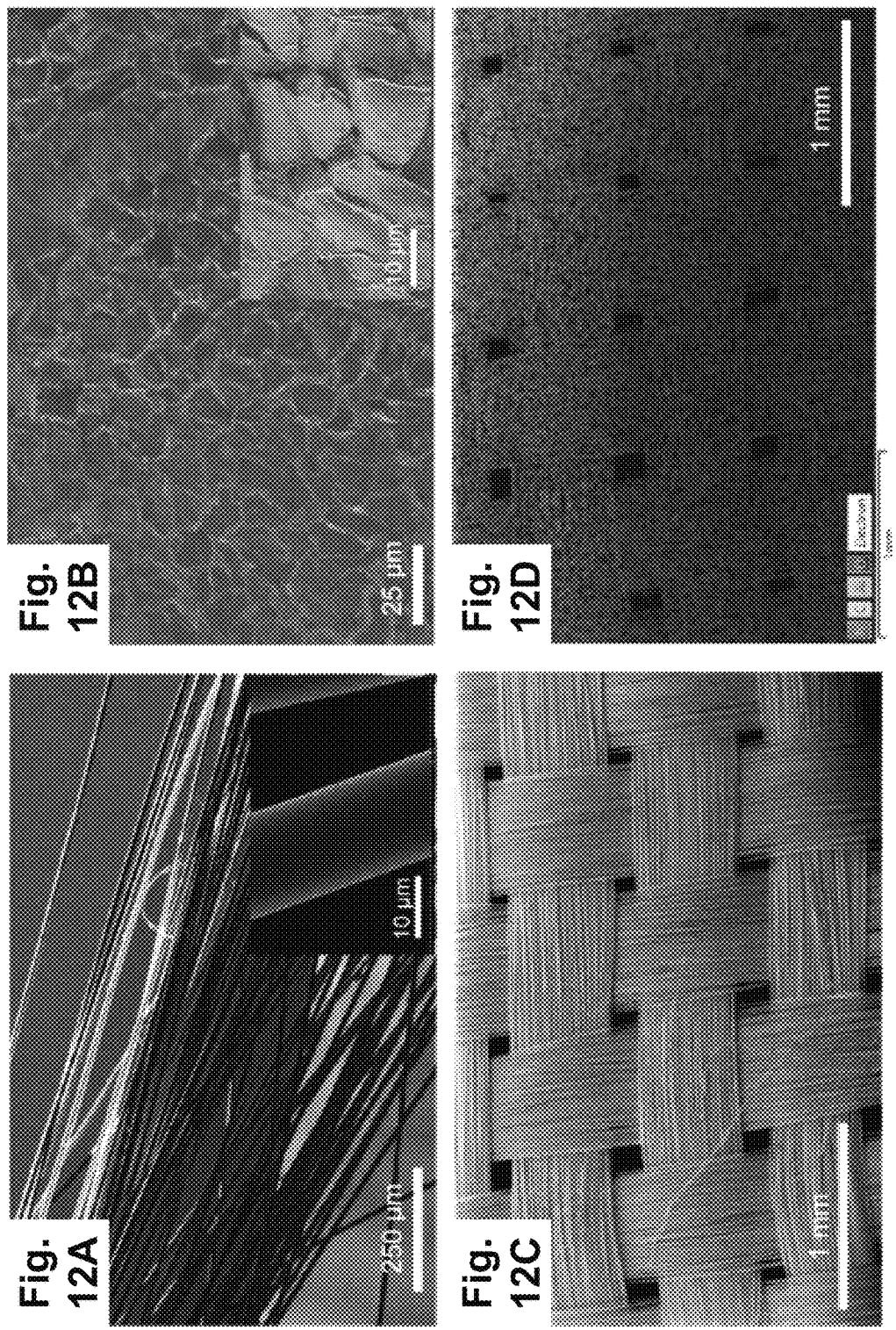
FIG. 12, comprising
Figure 13:
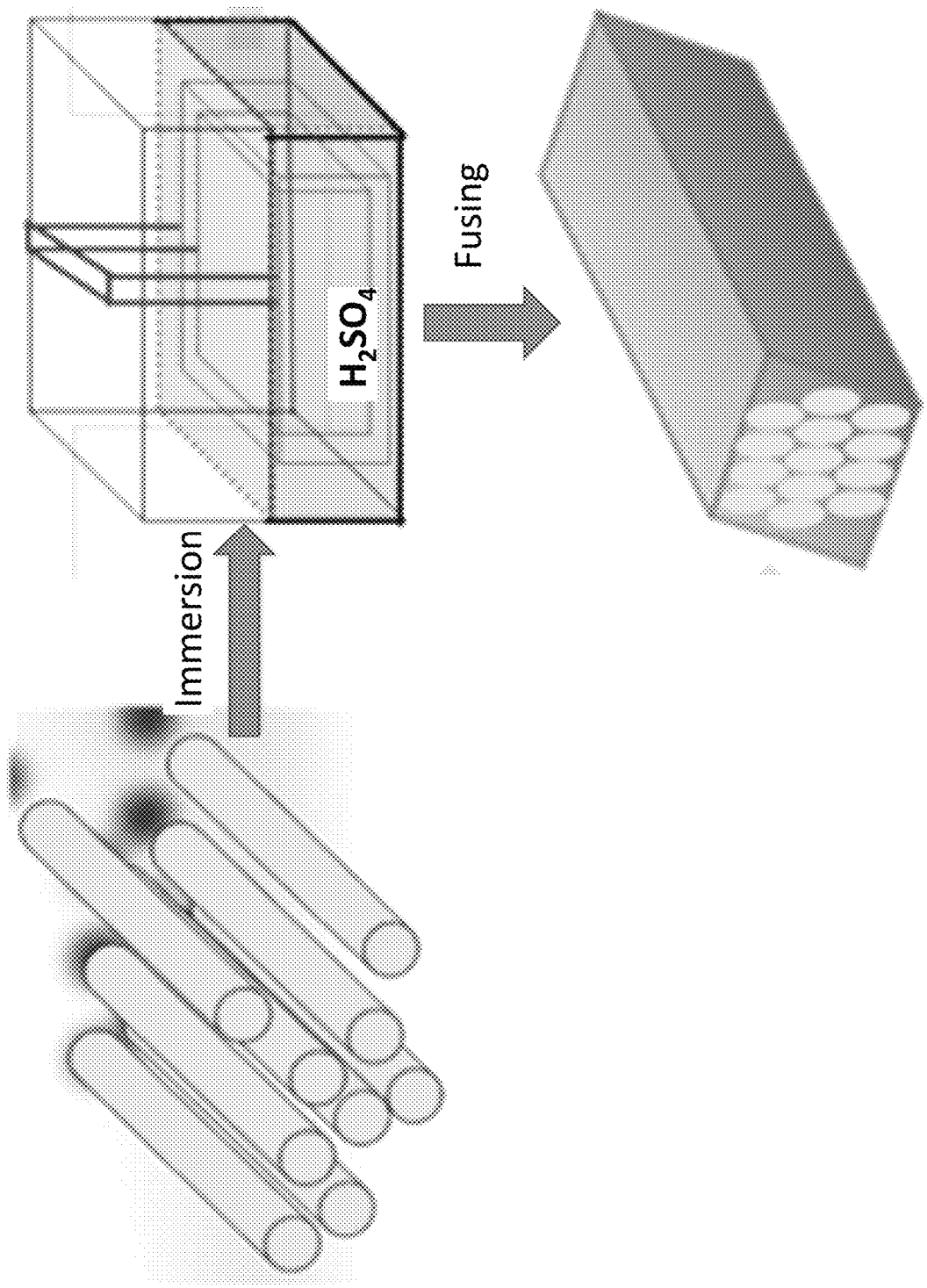
FIG. 13 is a schematic illustration of the acid treatment of PPTA fiber.
Figures 14, 14A:
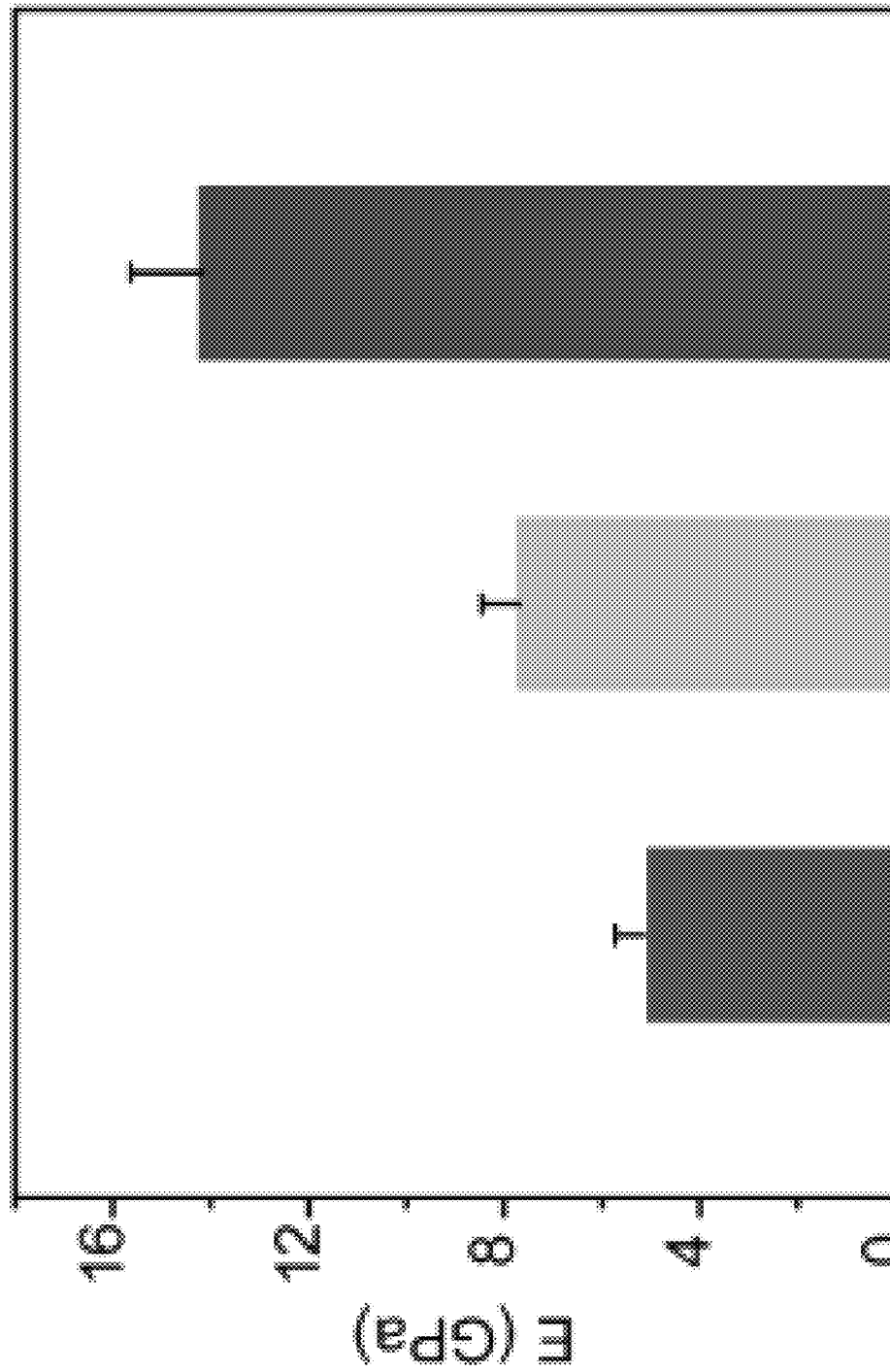
Figure 14:
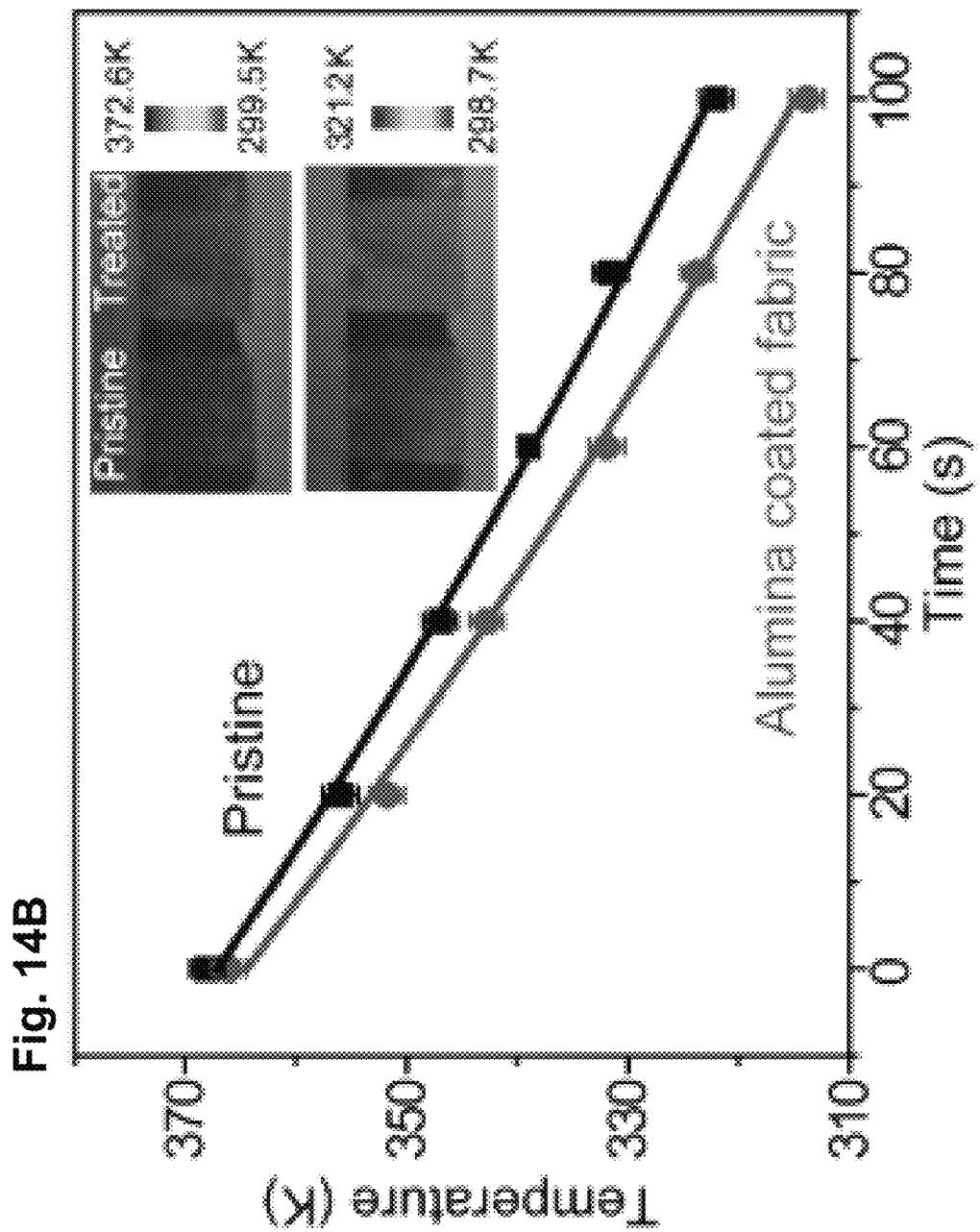
FIG. 14, comprising

To explore the potential for large-scale applications, PPTA fabric composites were prepared using a surface dissolution method in which the surface of the fibers are partially dissolved, allowing the fusion of individual fibers into self-reinforced structures (FIGS. 12A and 12B) (Zhang, et al., ACS Applied Materials & Interfaces, 2010, 2, 919-926). An illustration of such a process is given in FIG. 13. The PPTA fabrics were treated with concentrated sulfuric acid for a few seconds, which promotes a progressive formation of the matrix and the interphase and facilitates the transfer of stress between the fibers (FIG. 12B). In the second step, the PPTA fabric composites are coated with alumina shells. The formation of uniform alumina coatings on the fabrics was confirmed by SEM and by elemental mapping (FIGS. 12C and 12D). The mechanical properties of PPTA fabrics were enhanced as a result of each these steps: the Young's modulus of 5.5 GPa for the pristine PPTA was increased to 7.9 GPa following the acid treatment was further increased to 13.9 GPa after the fibers were coated with alumina (FIG. 14A). This increase in the Young's modulus confirms the enhancement of mechanical properties. In addition, the thermal diffusion rate of the PPTA fabric also increases after alumina coating, due in part to the large thermal conductivity of alumina (30 W/mK) compared to PPTA (0.04 W/mK). The fabric samples were cooled under the same conditions. Differences in chromatic aberration between the samples with and without alumina coating became more pronounced with longer cooling times (FIG. 14B, inset). The surface of the alumina-coated PPTA fabrics exhibit higher thermal conductivity, allowing the heat to diffuse faster compared to pristine PPTA fabrics, so the temperature of treated fabric is lower than that of the pristine fabric. This temperature difference reaches 2.2 degrees after 100 s, as indicated by near-infrared images, demonstrating the greater thermal conductivity of the surface treated-fabrics. This enhanced thermal conductivity has the potential to retard the physical degradation of PPTA fabrics.

The acid-pretreatment had a significant effect on the hardness of the resulting material. Hardness tests were performed on PPTA fabrics with alumina coatings with and without acid pre-treatment. The fabric that was subjected to alumina coating only (i.e., no acid pre-treatment) exhibited a hardness of about 2000 MPa. PPTA fabric subjected to the acid treatment prior to alumina coating exhibited a hardness of about 2500 MPa. These results suggest that the combination of acid pre-treatment and alumina coating has a significant and unexpected effect on the hardness of the resulting composite material.

PPTA hybrid materials obtained by coating the surface of PPTA single fibers and PPTA fabrics with ultrathin ceramic oxides, demonstrate significantly enhanced compressive mechanical properties, chemical stability, and thermal conductivity.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A method of fabricating a ceramic-polymer composite, the method comprising:
    providing a polymer material;
    contacting the polymer material with an acid solution to create an acid-treated polymer material; and
    depositing a ceramic on the acid-treated polymer material to create ceramic-polymer composite.

2. The method of claim 1, wherein the step of providing a polymer material comprises the step of providing a single polymeric fiber, a plurality of polymeric fibers, or a plurality of polymeric fibers in the form of a woven or non-woven fabric.

3. The method of claim 1, wherein the polymer material comprises a polymer selected from the group consisting of a polyolefin, a polyamide, an aramid, a polycarbonate, a polystyrene, a fluoropolymer, a polyester, an epoxy, a polybenzazole, an combinations or co-polymers thereof.

4. The method of claim 1, wherein the polymer material is poly(p-phenylene terephthalamide).

5. The method of claim 1, wherein the step of contacting the polymer with an acid solution further comprises the steps of:
    contacting the polymer material with a neutral solvent;
    neutralizing the polymer material; and
    rinsing the polymer material with a neutral solvent.

6. The method of claim 1, wherein the step of contacting the polymer material with an acid solution further comprises the step of drying the polymer material.

7. The method of claim 1, wherein the acid solution comprises sulfuric acid.

8. The method of claim 1, wherein the step of depositing a ceramic on the polymer material comprises the steps of:
    subjecting the polymer material to a first vapor precursor; and
    subjecting the polymer material to a second vapor precursor.

9. The method of claim 8, wherein the first vapor precursor is selected from the group consisting of trimethylaluminium, tris(diethylamido)aluminum, tris(ethylmethylamido)aluminum, diethylaluminum ethoxide, aluminum sec-butoxide, $AlCl_3$, and $AlBr_3$.

10. The method of claim 8, wherein the second vapor precursor is selected from the group consisting of $H_2O$, $O_2$, $O_3$, $N_2O$, $NO_2$, $N_2O_5$, and $H_2O_2$.

11. The method of claim 1, wherein the step of depositing a ceramic on the polymer material comprises the steps of:
    immersing the polymer material in a colloidal suspension of ceramic precursor; and
    adding a gelation catalyst to the colloidal suspension of ceramic precursor.

12. The method of claim 11, wherein the ceramic precursor is selected from the group consisting of tetraethyl orthosilicate, tetramethyl orthosilicate, tetrabutyl orthosilicate, tetrachlorosilane, and sodium silicate.

13. The method of claim 11, wherein the gelation catalyst is $NH_4OH$ or HCl.

* * * * *